US009747026B1

(12) United States Patent
Hua et al.

(10) Patent No.: US 9,747,026 B1
(45) Date of Patent: *Aug. 29, 2017

(54) LOW PIN COUNT SOLUTION USING CAPACITANCE SENSING MATRIX FOR KEYBOARD ARCHITECTURE

(71) Applicant: Creator Technology B.V., Tilburg (NL)

(72) Inventors: Liu Hua, Shanghai (CN); Jiang XiaoPing, Shanghai (CN)

(73) Assignee: Creator Technology B.V., Tilburg (NL)

( * ) Notice: Subject to any disclaimer, the term of this patent is extended or adjusted under 35 U.S.C. 154(b) by 0 days.

This patent is subject to a terminal disclaimer.

(21) Appl. No.: 14/697,107

(22) Filed: Apr. 27, 2015

Related U.S. Application Data

(63) Continuation of application No. 13/932,672, filed on Jul. 1, 2013, now Pat. No. 9,019,133, which is a
(Continued)

(51) Int. Cl.
*H03K 17/94* (2006.01)
*H03M 11/00* (2006.01)
(Continued)

(52) U.S. Cl.
CPC ........ *G06F 3/04886* (2013.01); *G06F 3/0202* (2013.01); *G06F 3/044* (2013.01); *H03K 17/9622* (2013.01)

(58) Field of Classification Search
CPC ...... G06F 3/0202; G06F 3/0383; G06F 3/044; G06F 3/16; G06F 3/017; G06F 3/018;
(Continued)

(56) References Cited

U.S. PATENT DOCUMENTS 4,242,676 A   12/1980   Piguet et al.
4,305,135 A   12/1981   Dahl et al.
(Continued)

FOREIGN PATENT DOCUMENTS

JP   1064386 A   3/1998

OTHER PUBLICATIONS

IPR2014-01302, Decision to Institution of Inter Parties Review of U.S. Pat. No. 8,059,015; 11 pgs.
(Continued)

*Primary Examiner* — Firmin Backer
*Assistant Examiner* — Jerold Murphy
(74) *Attorney, Agent, or Firm* — Jianq Chyun IP Office

(57) ABSTRACT

An apparatus and method for selecting a keyboard key based on a position of a presence of a conductive object on a sensing device and a pre-defined area of the keyboard key. The apparatus may include a sensing device and a processing device. The sensing device may include a plurality of sensor elements to detect a presence of a conductive object on the sensing device. Multiple keyboard keys are assigned to pre-defined areas of the sensing device. The processing device is coupled to the sensing device using capacitance sensing pins, and may be operable to determine a position of the presence of the conductive object, and to select a keyboard key based on the position of the conductive object and the pre-defined areas of the sensing device.

24 Claims, 14 Drawing Sheets

Related U.S. Application Data continuation of application No. 13/297,046, filed on Nov. 15, 2011, now Pat. No. 8,482,437, which is a continuation of application No. 11/440,924, filed on May 25, 2006, now Pat. No. 8,059,015.

(51) Int. Cl.

| | | |
|---|---|---|
| G01R 27/26 | (2006.01) | |
| G06F 3/041 | (2006.01) | |
| G06F 3/044 | (2006.01) | |
| G06F 3/045 | (2006.01) | |
| G08C 21/00 | (2006.01) | |
| G06F 3/0488 | (2013.01) | |
| G06F 3/02 | (2006.01) | |
| H03K 17/96 | (2006.01) | |

(58) Field of Classification Search
 CPC . G06F 3/03547; G06F 3/0426; H03K 17/962;
 H03K 17/9622
 USPC .................... 341/33; 345/173; 200/5 A, 600;
 400/479.1
 See application file for complete search history.

(56) References Cited

U.S. PATENT DOCUMENTS

| | | | |
|---|---|---|---|
| 4,495,485 A | 1/1985 | Smith | |
| 4,526,043 A | 7/1985 | Boie et al. | |
| 4,550,221 A | 10/1985 | Mabusth | |
| 4,686,332 A | 8/1987 | Greanis et al. | |
| 4,737,768 A | 4/1988 | Lewiner et al. | |
| 4,876,461 A | 10/1989 | Gratke | |
| 5,016,008 A | 5/1991 | Gruaz et al. | |
| 5,113,041 A | 5/1992 | Blonder et al. | |
| 5,305,017 A | 4/1994 | Gerpheide | |
| 5,374,787 A | 12/1994 | Miller et al. | |
| 5,459,463 A | 10/1995 | Gruaz et al. | |
| 5,463,388 A | 10/1995 | Boie et al. | |
| 5,499,026 A | 3/1996 | Liao et al. | |
| 5,508,700 A | 4/1996 | Taylor et al. | |
| 5,543,588 A | 8/1996 | Bisset et al. | |
| 5,648,642 A | 7/1997 | Miller et al. | |
| 5,952,998 A | 9/1999 | Clancy et al. | |
| 5,988,902 A | 11/1999 | Holehan et al. | |
| 6,025,726 A | 2/2000 | Gershenfeld et al. | |
| 6,137,427 A | 10/2000 | Binstead | |
| 6,452,514 B1 | 9/2002 | Philipp | |
| 6,504,530 B1 | 1/2003 | Wilson et al. | |
| 6,947,031 B2 | 9/2005 | Sandbach et al. | |
| 6,961,049 B2 | 11/2005 | Mulligan et al. | |
| 6,970,160 B2 | 11/2005 | Mulligan et al. | |
| 7,030,860 B1 | 4/2006 | Hsu et al. | |
| 7,054,965 B2 | 5/2006 | Bell et al. | |
| 7,301,351 B2 | 11/2007 | Deangelis et al. | |
| 7,391,861 B2 | 6/2008 | Levy | |
| 7,394,367 B1 | 7/2008 | Aupperle et al. | |
| 7,466,307 B2 | 12/2008 | Trent, Jr. et al. | |
| 7,663,607 B2 | 2/2010 | Hotelling et al. | |
| 7,821,425 B2 | 10/2010 | Philipp | |
| 7,821,502 B2 | 10/2010 | Hristov | |
| 7,844,914 B2 | 11/2010 | Andre et al. | |
| 8,482,437 B1 * | 7/2013 | Hua ..................... | G06F 3/0202 178/18.05 |
| 9,019,133 B1 * | 4/2015 | Hua ..................... | G06F 3/0202 324/662 |
| 2003/0011576 A1 | 1/2003 | Sandbach et al. | |
| 2004/0140993 A1 | 7/2004 | Geaghan et al. | |
| 2005/0024341 A1 | 2/2005 | Gillespie et al. | |
| 2006/0026521 A1 | 2/2006 | Hotelling et al. | |
| 2007/0008299 A1 * | 1/2007 | Hristov ................ | G06F 3/0416 345/173 |
| 2007/0046299 A1 | 3/2007 | Hargreaves et al. | |
| 2007/0063876 A1 | 3/2007 | Wong | |
| 2007/0229466 A1 | 10/2007 | Peng et al. | |
| 2007/0229468 A1 | 10/2007 | Peng et al. | |
| 2007/0229470 A1 | 10/2007 | Snyder et al. | |
| 2007/0236618 A1 | 10/2007 | Maag et al. | |
| 2008/0278178 A1 | 11/2008 | Philipp | |

OTHER PUBLICATIONS

IPR2014-01302, Petition to Institute an Inter Parties Review of U.S. Pat. No. 8,059,015; 62 pgs.
IPR2014-01302, Patent Owner's Preliminary Response in the Inter Parties Review of U.S. Pat. No. 8,059,015; 26 pgs.
IPR2014-01302, Patent Owner's Response in the Inter Parties Review of U.S. Pat. No. 8,059,015; 54 pgs.
IPR2014-01302, Judgment/Termination of the Proceedings in the Inter Parties Review of U.S. Pat. No. 8,059,015; 3 pgs.
IPR2014-01302, Exhibit-1001, U.S. Pat. No. 8,059,015; 30 pgs.
IPR2014-01302, Exhibit-1002, U.S. Pat. No. 5,463,388 to Boie et al.; 12 pgs.
IPR2014-01302, Exhibit-1004, U.S. Pat. No. 7,821,502 to Hristov; 16 pgs.
IPR2014-01302, Exhibit-1005, U.S. Appl. No. 60/697,613 to Hristov filed Jul. 13, 2005; 39 pgs.
IPR2014-01302, Exhibit-1010, Declaration of Dr. Phillip Wright; 157 pgs.
IPR2014-01302, Exhibit-1011, File History of U.S. Pat. No. 8,059,015; 702 pgs.
IPR2014-01302, Exhibit-1012, U.S. Pat. No. 7,844,914 to Andre et al.; 18 pgs.
IPR2014-01302, Exhibit-2001, U.S. Pat. No. 8,004,497 to XiaoPing; 27 pgs.
IPR2014-01302, Exhibit-2002, Petition to Institute an Inter Parties Review for U.S. Pat. No. 8,004,497; 68 pgs.
IPR2014-01302, Exhibit-2003, U.S. Pat. No. 8,519,973 to XiaoPing; 27 pgs.
IPR2014-01302, Exhibit-2004, Petition to Institute an Inter Parties Review for U.S. Pat. No. 8,519,073; 67 pgs.
IPR2014-01302, Exhibit-2005, *Liberty Mutual Ins. Comp. v. Progressive Ins. Comp.*, (CBM2012-00003, Order on Redundant Grounds, Oct. 25, 2012); 19 pgs.
IPR2014-01302, Exhibit-2006, *Oracle Corp. v. Clouding IP, LLC*, (IPR2013-00075, Decision on Request for Rehearing, Jun. 13, 2013); 7 pgs.
IPR2014-01302, Exhibit-2007, *Scentair Techs. v. Prolitec, Inc.*, (IPR2013-00179, Decision on Request for Rehearing, Aug. 23, 2013); 6 pgs.
IPR2014-01302, Exhibit-2008, *Larose Indus., LLC v. Capriola Corp.*, (IPR2013-00120, Decision on Petitioner's Request for Rehearing, Jul. 22, 2013); 7 pgs.
IPR2014-01302, Exhibit-2009, *Sony Corp. v. Yissum Research Development Co. of the Hebrew Univ. of Jerusalem*, (IPR2013-00219, Decision on Petitioners Request for Rehearing, Nov. 21, 2013); 9 pgs.
IPR2014-01302, Exhibit-2010, Patent and Trademark Office, Office Patent Trial Practice Guide (published in Fed. Reg. vol. 77, No. 157, Aug. 14, 2012); 20 pgs.
IPR2014-01302, Exhibit-2011, *Zoll Lifecor Corp. v. Koninklijke Philips Elecs. N.V.*, (IPR2013-00616, Order on Conduct of the Proceedings, Jan. 13, 2014); 4 pgs.
IPR2014-01302, Exhibit-2012, Congressional Record, 112th Congress, 1st Session, vol. 157, No. 34, S1348, Mar. 8, 2011 (Statement of Sen. Leahy); 7 pgs.
IPR2014-01302, Exhibit-2013, *ZTE Corp. v. ContentGuard Holdings, Inc.*, (IPR2013-00133, Order on Trial Hearing, Feb. 26, 2014); 3 pgs.
IPR2014-01302, Exhibit-2014, Figure 7 of U.S. Pat. No. 5,463,388, as annotated by Dr. Wright during his Apr. 30, 2015 deposition (1st Annotation); 1 pg.
IPR2014-01302, Exhibit-2015, Figure 7 of U.S. Pat. No. 5,463,388, as annotated by Dr. Wright during his Apr. 30, 2015 deposition (2nd Annotation); 1 pg.

(56) References Cited

OTHER PUBLICATIONS

IPR2014-01302, Exhibit-2016, Figure 7 of U.S. Pat. No. 5,463,388, as annotated by Dr. Wright during his Apr. 30, 2015 deposition (3rd Annotation); 1 pg.
IPR2014-01302, Exhibit-2017, Transcript of Deposition of Dr. Phillip Wright, taken Apr. 30, 2015; 44 pgs.
IPR2014-01302, Exhibit-2018, U.S. Pat Pub No. 2007/0008299 to Hristov; 17 pgs.
IPR2014-01302, Exhibit-2020, Declaration of Robert Dezmelyk; 47 pgs.
U.S. Final Rejection for U.S. Appl. No. 13/932,672 dated Jul. 24, 2014; 10 pages.
U.S. Non Final Rejection for U.S. Appl. No. 13/932,672 dated Dec. 30, 2013; 10 pages.
U.S. Non-Final Rejection for U.S. Appl. No. 11/440,924 dated Jan. 20, 2010; 9 pages.
U.S. Non-Final Rejection for U.S. Appl. No. 11/440,924 dated Mar. 10, 2009; 9 pages.
U.S. Non-Final Rejection for U.S. Appl. No. 13/297,046 dated Jun. 12, 2012; 7 pages.
U.S. Non-Final Rejection for U.S. Appl. No. 13/297,046 dated Oct. 5, 2012; 15 pages.
U.S. Non-Final Rejection, U.S. Appl. No. 11/440,924 dated Jun. 10, 2011; 8 pages.
U.S. Notice of Allowance for U.S. Appl. No. 11/440,924 dated Jul. 9, 2010; 6 pages.
U.S. Notice of Allowance for U.S. Appl. No. 11/440,924 dated Sep. 1, 2011; 7 pages.
U.S. Notice of Allowance for U.S. Appl. No. 11/440,924 dated Sep. 23, 2009; 6 pages.
U.S. Notice of Allowance for U.S. Appl. No. 13/932,672 dated Nov. 4, 2014; 8 pages.
U.S. Notice of Allowance for U.S. Appl. No. 13/932,672 dated Dec. 17, 2014; 9 pages.
U.S. Notice of Allowance for U.S. Appl. No. 13/297,046 dated May 9, 2013; 8 pages.
Case No. 4:13-cv-04034, Declaration of Jenny L. Golgate in Support of Defendant's Motion to Strike with Exhibit N, 16 pgs.
Case No. 4:13-cv-04034, Defendants' Corrected Notice of Motion and Motion to Strike with Exhibit M to Declaration of Jenny L. Colgate, 378 pgs.
Case No. 4:13-cv-04034, Second Declaration of Jenny L. Golgate in Support of Defendant's Motion to Strike with Exhibit O, 154 pgs.
Case No. 4:13-cv-04034, Cypress Semiconductor Corporation's Opposition to Defendants' Motion to Stay Proceedings with Williams Declaration and Exhibit 1, 37 pgs.
Case No. 4:13-cv-04034, Cypress Semiconductor Corporation's Opposition to Defendants' Motion to Strike with Woodsome Declaration, 22 pgs.
Case No. 4:13-cv-04034, Defendants' Reply in Further Support of Their Motion to Strike with Exhibit 1, 40 pgs.
Case No. 4:13-cv-04034, Order Denying Defendant's Motion to Strike, 3 pgs.
Case No. 4:13-cv-04034, Joint Claim Construction and Prehearing Statement with Exhibits A and B, 148 pgs.
Case No. 4:13-cv-04034, Defendants' Notice of Motion and Motion to Stay Proceedings Pending Determination of Petitions for Inter Partes Review with Jones Declaration and Exhibit L, 184 pgs.
Case No. 4:13-cv-04034, Amended Joint Claim Construction Prehearing Statement with Exhibit A, 23 pgs.
Case No. 4:13-cv-04034, Plaintiff's Opening Claim Construction Brief with Magee Declaration and Exhibit B, 63 pgs.
Case No. 4:13-cv-04034, Plaintiff's Opposition to Defendants' Motion to Stay Proceedings Pending Determination of Petitions for Inter Partes Review, 20 pgs.
Case No. 4:13-cv-04034, Reply in Support of Defendants' Motion to Stay Proceedings Pending Determination of Petitions for Inter Partes Review with Nam Declaration, and Jones Declaration with Exhibits F and G, 131 pgs.
Case No. 4:13-cv-04034, Defendants' Responsive Claim Construction Brief with Jones Declaration and Exhibits B and C, 72 pgs.
Case No. 4:13-cv-04034, Second Amended Joint Claim Construction Prehearing Statement with Exhibit A, 21 pgs.
Case No. 4:13-cv-04034, Plaintiff's Reply Claim Construction Brief, 19 pgs.
Case No. 4:13-cv-04034, Order Vacating Claims Construction Hearing, 1 pg.
Case No. 4:13-cv-04034, Order Granting Defendants' Motion to Stay Pending Determination of Petitions for Inter Partes Review, 7 pgs.
Case No. 5:13-cv-04183, Disclosure of Asserted Claims and Infringement Contentions of Cypress Semiconductor Corporation, 6 pgs.
Case No. 5:13-cv-04183, Disclosure of Asserted Claims and Infringement Contentions of Cypress Semiconductor Corporation, Exhibit 5, Infringement Chart for U.S. Pat. No. 8,059,015, 23 pgs.
Case No. 5:13-cv-04183, Disclosure of Asserted Claims and Infringement Contentions of Cypress Semiconductor Corporation, Exhibit 7, Chart of Accused Instrumentalities, 7 pgs.
Case No. 4:13-cv-04034, Disclosure of Asserted Claims and Infringement Contentions of Cypress Semiconductor Corporation, 7 pgs.
Case No. 4:13-cv-04034, Disclosure of Asserted Claims and Infringement Contentions of Cypress Semiconductor Corporation, Exhibit 5, Infringement Chart for U.S. Pat. No. 8,059,015, 18 pgs.
Case No. 4:13-cv-04034, Disclosure of Asserted Claims and Infringement Contentions of Cypress Semiconductor Corporation, Exhibit 7, Chart of Accused Instrumentalities, 15 pgs.
Case No. 4:13-cv-04034, Letter re Cypress' Infringement Contention Deficiencies, 7 pgs.
Case No. 4:13-cv-04034, Cypress Response to Letter re Cypress' Infringement Contention Deficiencies, 9 pgs.
Case No. 4:13-cv-04034, Cypress Response to Letter re Cypress' Infringement Contention Deficiencies, Exhibit A, 2 pgs.
Case No. 4:13-cv-04034, Cypress Response to Letter re Cypress' Infringement Contention Deficiencies, Exhibit B (combined), 70 pgs.
Case No. 4:13-cv-04034, Cypress Response to Letter re Cypress' Infringement Contention Deficiencies, Exhibit C, 2 pgs.
Case No. 4:13-cv-04034, Cypress Response to Letter re Cypress' Infringement Contention Deficiencies, Exhibit D, 3 pgs.
Case No. 4:13-cv-04034, Cypress Response to Letter re Cypress' Infringement Contention Deficiencies, Exhibit E, 55 pgs.
Case No. 4:13-cv-04034, Cypress Response to Letter re Cypress' Infringement Contention Deficiencies, Exhibit F, 7 pgs.
Case No. 4:13-cv-04034, LG's Invalidity Contentions and Document Production Pursuant to Patent Local Rules 3-3 and 3-4, 24 pgs.
Case No. 4:13-cv-04034, LG's Invalidity Contentions and Document Production Pursuant to Patent Local Rules 3-3 and 3-4, Exhibit B, pp. 1-300 of 1193.
Case No. 4:13-cv-04034, LG's Invalidity Contentions and Document Production Pursuant to Patent Local Rules 3-3 and 3-4, Exhibit B, pp. 301-1193 of 1193.
Case No. 4:13-cv-04034, LGE-CSC0001870, Smartskin: An Infrustructre for Freehand Manipulation on Interactive Surfaces, Jun Rekimoto, Sony Computer Science Laboratories, Inc., CHI 2002, Apr. 20-25, 2002 (ACM), 8 pgs.
Case No. 4:13-cv-04034, LGE-CSC0001865, "Soft Mahines: A Philosophy of User-Computer Interface Design," Lloyd H. Nakatani et al., CHI Proceedings '83, Dec. 1983 (ACM), 5 pgs.
Case No. 4:13-cv-04034, LGE-CSC0001856, "Capacitive Impedance Readout Tactile Image Sensor," R. A. Boie, Bell Laboratories, 1984 (IEEE), 9 pgs.
Case No. 4:13-cv-04034, LGE-CSC0000826, A.K. Leeper, 14:2 Integration of a Clear Capacitive Touch Screen with a 1/8-VGA FSTN-LCD to form and LCD-based TouchPad, 2002 Society for Information Display (SID) Symposium Digest (2002), 3 pgs.
Case No. 4:13-cv-04034, LGE-CSC0000844, Toshiba, Touch technology for today and tomorrow: Introducing the cPadTM to Toshiba notebooks, Toshiba Tech Briefs/Emerging Technologies, Sep. 16, 2002 (2002), 7 pgs.

(56) References Cited

OTHER PUBLICATIONS

Case No. 4:13-cv-04034, LGE-CSC0000835, Synaptics, Synaptics Announces Major Design Win with Toshiba for Leading-Edge Notebook, Synaptics press release, Mar. 4, 2002 (2002), 1 pg.
Case No. 4:13-cv-04034, LGE-CSC0000831, QMatrixTM Panel Design Guidelines, Quantum Research Application Note AN-KD01, 4 pgs.
Case No. 4:13-cv-04034, LGE-CSC0000786, EDN Europe, Tough touch screens need no seals, Electronic Design News Europe, pp. 23-31 (Oct. 13, 2005), 2 pgs.
Case No. 4:13-cv-04034, LGE-CSC0000788, EP&Dee, A new QFieldTM technology, http://www.epd-ee.eu/article/2847 (downloaded Mar. 6, 2014) Oct. 20, 2005, 2 pgs.
Case No. 4:13-cv-04034, LGE-CSC0000829, Medical Design Technology, Touch Panel, p. 32, Dec. 2005 (2005), 2 pgs.
Case No. 4:13-cv-04034, LGE-CSC0000836, Synaptics White Paper WP-12, New Touch Screens Improve Handheld Human Interface, (2001), 6 pgs.
Case No. 4:13-cv-04034, LGE-CSC0000842, Three-Five Systems, Three-Five Systems Partners with Synaptics to Offer Touch Screen LCD Solutions, Three-Five Systems press release, Jul. 24, 2000 (2000), 2 pgs.
Case No. 4:13-cv-04034, LGE-CSC0000770, Bill Howard, cPad Enhances Toshiba Notebook, PC Magazine Review, Jun. 30, 2002 (2002), 4 pgs.
Case No. 4:13-cv-04034, Amended Invalidity Contentions and Supplemental Document Production Pursuant to Patent Local Rules 3-3 and 3-4, 31 pgs.
Case No. 4:13-cv-04034, LGE-CSC0112484, 2005 prototype of the Apple iPhone. See generally Jacqui Cheng, Exclusive: Super-Early iPHone Prototype Had 5"×7" Screen, Serial Port, (Mar. 11, 2013), 14 pgs.
Case No. 4-13-cv-04034, LGE-CSC0080673, "DiamondTouch: A Multi-User Touch Technology", P. Dietz et al., Mitsubishi Electric Research Laboratories, UIST 01, Nov. 11-14, 2001, Oralndo, FLA, 8 pgs.
Case No. 4:13-cv-04034, Amended Invalidity Contentions and Supplemental Document Production Pursuant to Patent Local Rules 3-3 and 3-4, Exhibit B-1, 79 pgs.
Case No. 4:13-cv-04034, Amended Invalidity Contentions and Supplemental Document Production Pursuant to Patent Local Rules 3-3 and 3-4, Exhibit B-2, 101 pgs.
Case No. 4:13-cv-04034, Amended Invalidity Contentions and Supplemental Document Production Pursuant to Patent Local Rules 3-3 and 3-4, Exhibit B-3, 188 pgs.
Case No. 4:13-cv-04034, Amended Invalidity Contentions and Supplemental Document Production Pursuant to Patent Local Rules 3-3 and 3-4, Exhibit B-4, 95 pgs.
Case No. 4:13-cv-04034, Amended Invalidity Contentions and Supplemental Document Production Pursuant to Patent Local Rules 3-3 and 3-4, Exhibit B-5, 69 pgs.
Case No. 4:13-cv-04034, Amended Invalidity Contentions and Supplemental Document Production Pursuant to Patent Local Rules 3-3 and 3-4, Exhibit B-6, 173 pgs.
Case No. 4:13-cv-04034, Amended Invalidity Contentions and Supplemental Document Production Pursuant to Patent Local Rules 3-3 and 3-4, Exhibit B-7, 75 pgs.
Case No. 4:13-cv-04034, Amended Invalidity Contentions and Supplemental Document Production Pursuant to Patent Local Rules 3-3 and 3-4, Exhibit B-8, 92 pgs.
Case No. 4:13-cv-04034, Amended Invalidity Contentions and Supplemental Document Production Pursuant to Patent Local Rules 3-3 and 3-4, Exhibit B-9, 63 pgs.
Case No. 4:13-cv-04034, Amended Invalidity Contentions and Supplemental Document Production Pursuant to Patent Local Rules 3-3 and 3-4, Exhibit B-11, 104 pgs.
Case No. 4:13-cv-04034, Amended Invalidity Contentions and Supplemental Document Production Pursuant to Patent Local Rules 3-3 and 3-4, Exhibit B-12, 16 pgs.
Case No. 4:13-cv-04034, Amended Invalidity Contentions and Supplemental Document Production Pursuant to Patent Local Rules 3-3 and 3-4, Exhibit B-13, 63 pgs.
Case No. 4:13-cv-04034, QSlideTM Touch Slider IC, QT401 R10.04/0505, Quantum Research Group (2004), 16 pgs.
IPR 2014-01496, Petition to Institute an Inter Parties Review of U.S. Pat. No. 8,059,015; 54 pgs.
IPR 2014-01496, Petition to Institute an Inter Parties Review of U.S. Pat. No. 8,059,015; Exhibit-1001, U.S. Pat. No. 8,059,015 to Hua et al.; 30 pgs.
IPR 2014-01496, Petition to Institute an Inter Parties Review of U.S. Pat. No. 8,059,015; Exhibit-1002, U.S. Pat. No. 6,137,427 to Binstead; 17 pgs.
IPR 2014-01496, Petition to Institute an Inter Parties Review of U.S. Pat. No. 8,059,015; Exhibit-1003, U.S. Pat. No. 7,391,861 to Levy; 38 pgs.
IPR 2014-01496, Petition to Institute an Inter Parties Review of U.S. Pat. No. 8,059,015; Exhibit-1004, U.S. Pat. No. 5,463,388 to Boie et al.; 12 pgs.
IPR 2014-01496, Petition to Institute an Inter Parties Review of U.S. Pat. No. 8,059,015; Exhibit-1005, U.S. Pat. No. 7,821,502 to Hristov; 16 pgs.
IPR 2014-01496, Petition to Institute an Inter Parties Review of U.S. Pat. No. 8,059,015; Exhibit-1006, U.S. Appl. No. 60/697,613 to Hristov; 39 pgs.
IPR 2014-01496, Petition to Institute an Inter Parties Review of U.S. Pat. No. 8,059,015; Exhibit-1007, Declaration of Daniel J. Wigdor; 59 pgs.
IPR 2014-01496, Petition to Institute an Inter Parties Review of U.S. Pat. No. 8,059,015; Exhibit-1008, Infringement Contentions Served by Patent Owner; 193 pgs.
IPR 2014-01496, Petition to Institute an Inter Parties Review of U.S. Pat. No. 8,059,015; Exhibit-1009, Curriculum Vita for Daniel J. Wigdor; 17 pgs.
IPR 2014-01496, Petition to Institute an Inter Parties Review of U.S. Pat. No. 8,059,015; Exhibit-1010, Excerpts from the prosecution history of U.S. Pat. No. 8,059,015; 403 pgs.
IPR 2014-01496, Judgment—Termination of the Proceeding, 3 pgs.

* cited by examiner

|  | Column 0 | Column 1 | Column 2 | Column 3 |  | Result 0 | Result 1 | Result 2 | Result 3 |
|---|---|---|---|---|---|---|---|---|---|
| Row 0 |  |  |  |  |  | 1 | 1 | 1 | 1 |
| Row 1 |  |  |  |  |  | 1 | 1 | 1 | 1 |
| Row 2 |  |  |  |  |  | 1 | 1 | 1 | 1 |
| Row 3 |  |  |  |  |  | 1 | 1 | 1 | 1 |
|  |  |  |  |  |  | ↑ 110 |  |  |  |
| Pattern 0 | 0 | 1 | 1 | 1 |  |  |  |  |  |
| Pattern 1 | 1 | 0 | 1 | 1 |  |  |  |  |  |
| Pattern 2 | 1 | 1 | 0 | 1 | ← 109 |  |  |  |  |
| Pattern 3 | 1 | 1 | 1 | 0 |  |  |  |  |  |

Scan Results For No Key Press    FIG. 1C

|  | Column 0 | Column 1 | Column 2 | Column 3 |  | Result 0 | Result 1 | Result 2 | Result 3 |
|---|---|---|---|---|---|---|---|---|---|
| Row 0 (111) |  |  |  |  |  | 1 | 1 | 1 | 1 |
| Row 1 |  | ● |  |  |  | 1 | 0 | 1 | 1 |
| Row 2 |  |  |  |  |  | 1 | 1 | 1 | 1 |
| Row 3 |  |  |  |  |  | 1 | 1 | 1 | 1 |
|  |  |  |  |  |  | ↑ 113 |  |  |  |
| Pattern 0 | 0 | 1 | 1 | 1 |  |  |  |  |  |
| Pattern 1 | 1 | 0 | 1 | 1 |  |  |  |  |  |
| Pattern 2 | 1 | 1 | 0 | 1 | ← 112 |  |  |  |  |
| Pattern 3 | 1 | 1 | 1 | 0 |  |  |  |  |  |

Scan Results for Key $_{1,1}$ Pressed

FIG. 1D

LOW PIN COUNT SOLUTION USING CAPACITANCE SENSING MATRIX FOR KEYBOARD ARCHITECTURE

CROSS-REFERENCE TO RELATED APPLICATIONS

This application is a continuation of U.S. patent application Ser. No. 13/932,672, filed Jul. 1, 2013, which is a continuation of U.S. patent application Ser. No. 13/297,046, filed Nov. 15, 2011, now U.S. Pat. No. 8,482,437, issued Jul. 9, 2013, which is a continuation of U.S. patent application Ser. No. 11/440,924, filed May 25, 2006, now U.S. Pat. No. 8,059,015, issued Nov. 15, 2011, all of which are incorporated by reference herein in their entirety.

TECHNICAL FIELD

This invention relates to the field of user interface devices and, in particular, to touch-sensing devices.

BACKGROUND

Computing devices, such as notebook computers, personal data assistants (PDAs), and mobile handsets, have user interface devices, which are also known as human interface device (HID). One such user interface device is a keyboard. Keyboards include a set of input keys for the computing device. The input keys may be standard typewriter keys, such as the alphabetic letters and numbers. The input keys may also include several specialized keys, such as Enter, Control, Alt, Delete, Escape, Cursor keys, and the like.

FIG. 1A illustrates a resistance matrix of a conventional keyboard. Conventional keyboard 100 includes a keyboard architecture using a resistance matrix. The resistance matrix includes multiple rows (Xo-X2) 101(0)-101(2), and multiple columns (Yo-Y2) 102(0)-102(2). All the rows 101(0)-101(2) are each connected to a pullup resistor (e.g., 103(0)-103(2)), and all the columns 102(0)-102(2) are each connected to a pull-down transistor (e.g., 104(0)-104(2)), such as an N-Channel MOSFET (NMOS). Above the resistance matrix there are multiple buttons 105(0)-105(8) (e.g., keyboard keys). Upon pressing a button, the corresponding row and column (X, Y) will be shorted together. For example, the row X will read "0," otherwise the row X is "1."

One example of the resistance matrix for a PC is a PS/2 keyboard. The PS/2 keyboard typically has between 101 and 104 keys that are uniquely positioned in a resistance scan matrix. The scan matrix consists of M rows and N columns, all of which are electrically isolated from each other. On average, the number of rows (M) is no greater than 8, and the number of columns (N) is no greater than 20. Each key sits over two isolated contacts of its corresponding row and column in the scan matrix. When a keyboard key 108 is pressed, the two contacts 106 and 107 are shorted together, and the row and column of the keyboard key 108 are electrically connected, as illustrated in FIG. 1B.

The PS/2 keyboard may include an embedded controller that performs a variety of tasks, all of which help to cut down on the overall system overhead. The PS/2 controller may monitor the keys and report to the main computer whenever a keyboard key is pressed or released. FIG. 1C illustrates scan results for no keyboard keys pressed on a conventional resistance scan matrix. The controller writes a scan pattern 109 out to the column lines consisting of all is and one 0 which is shifted through each column. In FIG. 1C no keyboard keys are pressed, resulting in all is in the scan results 110 being read at the row lines. FIG. 1D illustrates scan results for a keyboard key 111 pressed on a conventional resistance scan matrix. The controller writes a scan pattern 112 out to the column lines consisting of all is and one 0 which is shifted through each column. The scan results 113 are then read at the row lines. If a 0 is propagated to a row line, then the key 111 at the intersection of that column and row has been pressed.

The conventional resistance scan matrix designs described have large pin counts because every row and every column is connected to a pin. The pin count for these conventional resistance matrix keyboards is the sum of the number of rows and the number of columns. For example, the PC keyboard needs at least 21 pins to build a resistance scan matrix. Having a large pin count, may increase the die area of the circuit, or alternatively, or may decrease the robustness of the circuit by decreasing the possibility of additional functionality in the same circuit with limited pins. Also, the resistance scan matrix keyboards cannot be built in very small areas because it is limited by the pull-up resistor and mechanical button for each keyboard key. For example, the mechanical button of each keyboard key may have an area of about 0.5 centimeters (cm)×0.5 cm, the total keyboard area will be at least 25.25 $cm^2$ for a keyboard having 101 keyboard keys (e.g., 101×0.5 cm×0.5 cm=25.25 $cm^2$).

Another conventional keyboard may include a virtual keyboard. Virtual keyboards are a representation of a keyboard displayed on a touch screen. Tapping the "virtual keys" with a stylus or finger is the same as pressing a real key on a keyboard. For example, a PDA may supply keyboard functionality by providing a keyboard displayed on the touch screen of the PDA, instead of including the mechanical keyboard keys on the assembly of the PDA. This design, however, may take up too much precious real estate on the display.

Another example of a conventional virtual keyboard is a representation of a keyboard projected onto a flat surface such as a desktop. Using fingers as with a normal keyboard, an optical or electronic beam is used to pick up the tapping of the keyboard keys of the projected image. Such a device enables PDAs and other small handhelds to create a full-size keyboard. One example of this type of virtual keyboards is a virtual laser keyboard (VKB). The VKB works by using both infrared and laser technology to produce an invisible circuit and project a full-size virtual QWERTY keyboard on to any surface. The virtual PC keyboard behaves exactly like a real one: direction technology based on optical recognition enables the user to tap the images of the keys, which feeds into the compatible PDA, Smartphone, laptop or PC. QWERTY refers to a standard English-language typewriter keyboard (sometimes called the Sholes keyboard after its inventor), as opposed to Dvorak, foreign-language layouts (e.g. "keyboard AZERTY" in French-speaking countries), a space-cadet, or APL keyboards.

BRIEF DESCRIPTION OF THE DRAWINGS

The present invention is illustrated by way of example, and not by way of limitation, in the figures of the accompanying drawings.

FIG. 1C illustrates scan results for no keyboard keys pressed on a conventional resistance scan matrix.

FIG. 1D illustrates scan results for a keyboard key pressed on a conventional resistance scan matrix.

DETAILED DESCRIPTION

Figure 1A:
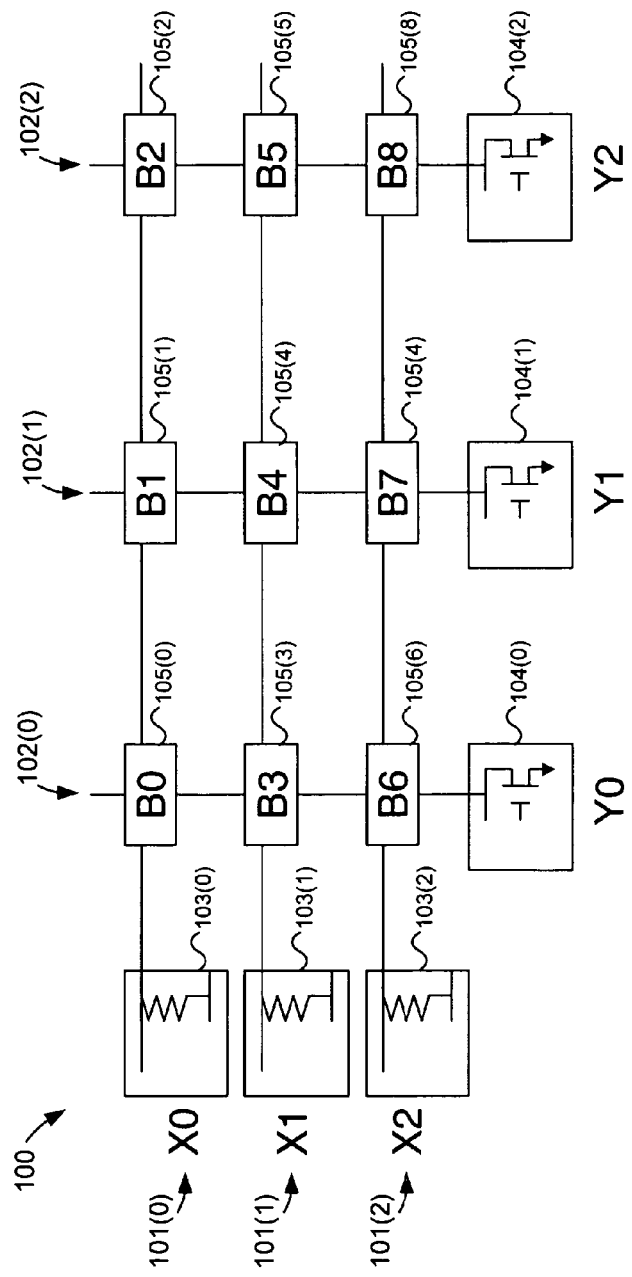
FIG. 1A illustrates a resistance matrix of a conventional keyboard.
Figure 1B:
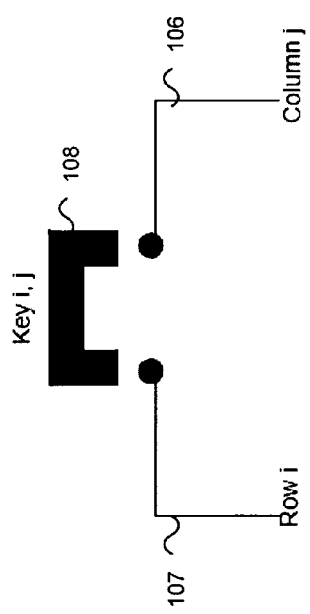
FIG. 1B illustrates a keyboard key and two electrical contacts of the conventional resistance matrix of FIG. 1A.

Described herein is an apparatus and method for selecting a keyboard key based on a position of a presence of a conductive object on a sensing device and a pre-defined area of the keyboard key. The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the spirit and scope of the present invention.

Embodiments described herein use a capacitance sensor matrix in a keyboard architecture to lower a pin count between a sensing device, which includes the capacitance sensor matrix, and a processing device. This keyboard architecture may be implemented in a smaller area on a device, than the conventional architectures, such as the conventional scan matrix described above.

As described in more detail below, the sensing device has a capacitance sensor matrix, which includes multiple sensor elements that are configured in rows and columns. The keyboard keys of a keyboard can be assigned a pre-determined area on the sensor matrix. The sensor matrix is used to detect a presence of a conductive object, such as a finger or a stylus. Each keyboard key, being assigned a different pre-determined area on the sensor matrix, will provide a different capacitance variation from the sensor matrix to the processing device, as the conductive object is detected. The capacitance variation can be measured on the multiple capacitance sensing pins that are used to couple the sensing device to the processing device. The capacitance variation measured on the capacitance sensing pins can be used by the processing device to determine the x- and y-coordinate (e.g., X/Y location) of the detected presence of the conductive object on the sensing device. For example, 48 buttons are assigned into different pre-determined areas of a sensor matrix, having two rows and two columns, as illustrated in FIG. 6B below. The two rows and two columns are coupled to the processing device using four capacitance sensing pins. The capacitance variation measured on the four pins can be used to determine the position of the conductive object.

As described in more detail below multiple keyboard keys can be assigned to pre-determined areas on a single sensor element. The capacitance variation measured on the capacitance sensing pins can be used to distinguish which keyboard key has been pressed. For example, a first keyboard key, keyboard key A, is assigned between 1 and 3 in the x-direction, and between 5 and 7 in the y-direction (e.g., $\{1 \leq X \leq 3 \ \& \ 5 \leq Y \leq 7\}$). A second keyboard key, keyboard key B, is assigned between 5 and 7 in the x-direction and between 5 and 7 in the y-direction (e.g., $\{5<X<7 \ \& \ 5<Y<7\}$). If the A or B keyboard key has been pressed, the X/Y location should be within the areas of A or B, respectively.

Using the capacitance sensor matrix, the measurements on the capacitance sensor matrix (e.g., capacitance variation) may include additional information than just "connect" or "disconnect," instead of only including "connect" or "disconnect" information in a conventional resistance matrix. The additional information is the location of the detected conductive object. The pressed key is outputted after comparing the located X/Y position of the conductive object and the pre-defined areas of the capacitance sensor matrix.

By assigning the different keys into different areas of the matrix and using the capacitance sensor matrix, the keyboard keys can be assigned to smaller areas than keys of a resistance matrix. This allows a keyboard (e.g., full personal computer (PC) keyboard, having 101 keys or more) to be implemented in smaller areas than the conventional keyboards that use resistance matrices. For example, a full keyboard having 101 keyboard keys, for example, can be implemented on a mobile handset. Instead of sacrificing real estate on a touch-screen display to implement the keyboard functions, the full keyboard can be mounted on the mobile handset as an additional user input device. This allows no sacrifice to the real estate of the touch-screen display, and avoids increased costs of providing the additional keyboard functionality to the device that operates the touch-screen display.

By decreasing the pin count of the keyboard, using the capacitance sensor matrix, the costs to manufacture the device also decrease. For example, the die cost is less than a device that requires more pins to implement the same number of keyboard keys. Similarly, by decreasing the pin count of the keyboard, the processing device may be used to further support other devices, such as additional user input devices (e.g., mouse, touch-sensor pad, touch-sensor sliders, touch-sensor buttons, touch-screen displays, and the like).

For example, in a PC interface, the keyboard and cursor positioning device (e.g., mouse or touch-sensor pad) are the most commonly used user input devices. Because the conventional solution for keyboards require at least 21 general purpose input-output (GPIO) pins, and the cursor positioning requires about 12 GPIO pins, companies design two separate integrated circuits to control both user input devices (e.g., one higher pin count chip for the keyboard, and one lower pin count chip for the cursor positioning device. However, using the capacitance sensor matrix described herein, a keyboard and a cursor positioning device may be controlled or supported by a single chip (e.g., processing device) because the pin count for the keyboard has been reduced using the capacitance sensor matrix and capacitance sensing pins. Having a single chip reduces mask and die costs for the design.

Figure 2:
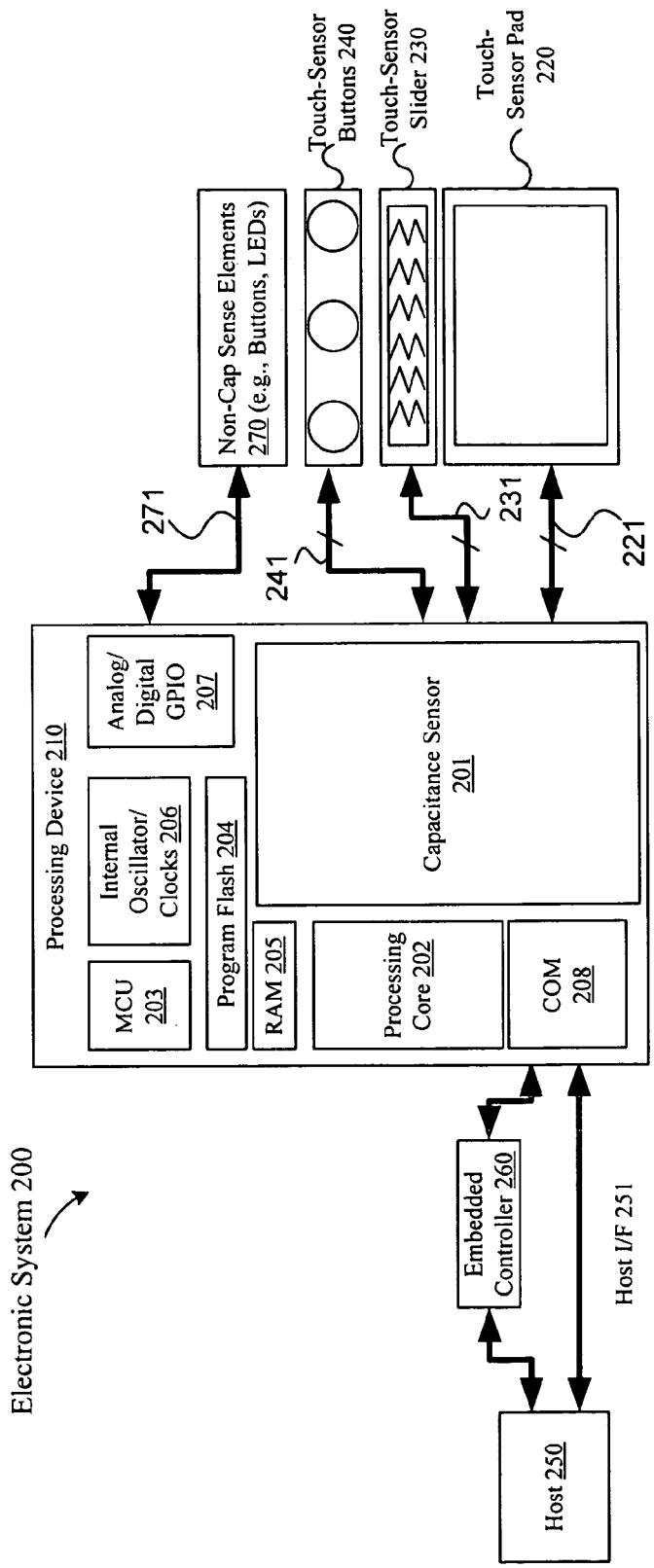
FIG. 2 illustrates a block diagram of one embodiment of an electronic system having a processing device for detecting a presence of a conductive object.

FIG. 2 illustrates a block diagram of one embodiment of an electronic system having a processing device for detecting a presence of a conductive object. Electronic system 200 includes processing device 210, touch-sensor pad 220, touch-sensor slider 230, touch-sensor buttons 240, host processor 250, embedded controller 260, and non-capacitance sensor elements 270. The processing device 210 may include analog and/or digital general purpose input/output ("GPIO") ports 207. GPIO ports 207 may be programmable. GPIO ports 207 may be coupled to a Programmable Interconnect and Logic ("PIL"), which acts as an interconnect between GPIO ports 207 and a digital block array of the processing device 210 (not illustrated). The digital block array may be configured to implement a variety of digital logic circuits (e.g., DAC, digital filters, digital control systems, etc.) using, in one embodiment, configurable user modules ("UMs"). The digital block array may be coupled to a system bus. Processing device 210 may also include memory, such as random access memory (RAM) 205 and program flash 204. RAM 205 may be static RAM (SRAM), and program flash 204 may be a non-volatile storage, which may be used to store firmware (e.g., control algorithms executable by processing core 202 to implement operations described herein). Processing device 210 may also include a memory controller unit (MCU) 203 coupled to memory and the processing core 202.

The processing device 210 may also include an analog block array (not illustrated). The analog block array is also coupled to the system bus. Analog block array also may be configured to implement a variety of analog circuits (e.g., ADC, analog filters, etc.) using, in one embodiment, configurable UMs. The analog block array may also be coupled to the GPIO 207.

As illustrated, capacitance sensor 201 may be integrated into processing device 210. Capacitance sensor 201 may include analog I/O for coupling to an external component, such as touch-sensor pad 220, touch-sensor slider 230, touch-sensor buttons 240, and/or other devices. Capacitance sensor 201 and processing device 202 are described in more detail below.

It should be noted that the embodiments described herein are not limited to touch-sensor pads for notebook implementations, but can be used in other capacitive sensing implementations, for example, the sensing device may be a touch-sensor slider 230, or a touch-sensor button 240 (e.g., capacitance sensing button). Similarly, the operations described herein are not limited to notebook cursor operations, but can include other operations, such as lighting control (dimmer), volume control, graphic equalizer control, speed control, or other control operations requiring gradual adjustments. It should also be noted that these embodiments of capacitive sensing implementations may be used in conjunction with non-capacitive sensing elements, including but not limited to pick buttons, sliders (ex. display brightness and contrast), scroll-wheels, multi-media control (ex. volume, track advance, etc) handwriting recognition and numeric keypad operation.

In one embodiment, the electronic system 200 includes a touch-sensor pad 220 coupled to the processing device 210 via bus 221. Touch-sensor pad 220 may include a multi-dimension sensor array. The multi-dimension sensor array comprises a plurality of sensor elements, organized as rows and columns. In another embodiment, the electronic system 200 includes a touch-sensor slider 230 coupled to the processing device 210 via bus 231. Touch-sensor slider 230 may include a single-dimension sensor array. The single-dimension sensor array comprises a plurality of sensor elements, organized as rows, or alternatively, as columns. In another embodiment, the electronic system 200 includes a touch-sensor button 240 coupled to the processing device 210 via bus 241. Touch-sensor button 240 may include a single-dimension or multi-dimension sensor array. The single- or multi-dimension sensor array comprises a plurality of sensor elements. For a touch-sensor button, the plurality of sensor elements may be coupled together to detect a presence of a conductive object over the entire surface of the sensing device. Alternatively, the touch-sensor button 240 has a single sensor element to detect the presence of the conductive object. In one embodiment, the touch-sensor button 240 may be a capacitance sensor element. Capacitance sensor elements may be used as non-contact switches. These switches, when protected by an insulating layer, offer resistance to severe environments.

The electronic system 200 may include any combination of one or more of the touch-sensor pad 220, touch-sensor slider 230, and/or touch-sensor button 240. In another embodiment, the electronic system 200 may also include non-capacitance sensor elements 270 coupled to the processing device 210 via bus 271. The non-capacitance sensor elements 270 may include buttons, light emitting diodes (LEDs), and other user interface devices, such as a mouse, a keyboard, or other functional keys that do not require capacitance sensing. In one embodiment, buses 271, 241, 231, and 221 may be a single bus. Alternatively, these buses may be configured into any combination of one or more separate buses.

The processing device may also provide value-added functionality such as keyboard control integration, LEDs, battery charger, and general purpose I/O, as illustrated as non-capacitance sensor elements 270. Non-capacitance sensor elements 270 are coupled to the GPIO 207.

Processing device 210 may include internal oscillator/clocks 206 and communication block 208. The oscillator/clocks block 206 provides clock signals to one or more of the components of processing device 210. Communication block 208 may be used to communicate with an external component, such as a host processor 250, via host interface (I/F) line 251. Alternatively, processing block 210 may also be coupled to embedded controller 260 to communicate with the external components, such as host 250. Interfacing to the host 250 can be through various methods. In one exemplary embodiment, interfacing with the host 250 may be done using a standard PS/2 interface to connect to an embedded controller 260, which in turn sends data to the host 250 via low pin count (LPC) interface. In some instances, it may be beneficial for the processing device 210 to do both touch-sensor pad and keyboard control operations, thereby freeing up the embedded controller 260 for other housekeeping functions. In another exemplary embodiment, interfacing may be done using a universal serial bus (USB) interface directly coupled to the host 250 via host interface line 251. Alternatively, the processing device 210 may communicate to external components, such as the host 250 using industry standard interfaces, such as USB, PS/2, inter-integrated circuit (I2C) bus, or system packet interfaces (SPI). The host 250 and/or embedded controller 260 may be coupled to the processing device 210 with a ribbon or flex cable from an assembly, which houses the sensing device and processing device.

In one embodiment, the processing device 210 is configured to communicate with the embedded controller 260 or the host 250 to send and/or receive data. The data may be a command or alternatively a signal. In an exemplary embodiment, the electronic system 200 may operate in both standard-mouse compatible and enhanced modes. The standard-mouse compatible mode utilizes the HID class drivers already built into the Operating System (OS) software of host 250. These drivers enable the processing device 210 and sensing device to operate as a standard cursor control user interface device, such as a two-button PS/2 mouse. The enhanced mode may enable additional features such as scrolling (reporting absolute position) or disabling the sensing device, such as when a mouse is plugged into the notebook. Alternatively, the processing device 210 may be configured to communicate with the embedded controller 260 or the host 250, using non-OS drivers, such as dedicated touch-sensor pad drivers, or other drivers known by those of ordinary skill in the art.

In other words, the processing device 210 may operate to communicate data (e.g., commands or signals) using hardware, software, and/or firmware, and the data may be communicated directly to the processing device of the host 250, such as a host processor, or alternatively, may be communicated to the host 250 via drivers of the host 250, such as OS drivers, or other non-OS drivers. It should also be noted that the host 250 may directly communicate with the processing device 210 via host interface 251.

In one embodiment, the data sent to the host 250 from the processing device 210 includes click, double-click, movement of the cursor, scroll-up, scroll-down, scroll-left, scroll-right, step Back, and step Forward. Alternatively, other user interface device commands may be communicated to the host 250 from the processing device 210. These commands may be based on gestures occurring on the sensing device that are recognized by the processing device, such as tap, push, hop, and zigzag gestures. Alternatively, other commands may be recognized. Similarly, signals may be sent that indicate the recognition of these operations.

In particular, a tap gesture, for example, may be when the finger (e.g., conductive object) is on the sensing device for less than a threshold time. If the time the finger is placed on the touchpad is greater than the threshold time it may be considered to be a movement of the cursor, in the x- or y-axes. Scroll-up, scroll-down, scroll-left, and scroll-right, step back, and step-forward may be detected when the absolute position of the conductive object is within a pre-defined area, and movement of the conductive object is detected.

Processing device 210 may reside on a common carrier substrate such as, for example, an integrated circuit (IC) die substrate, a multi-chip module substrate, or the like. Alternatively, the components of processing device 210 may be one or more separate integrated circuits and/or discrete components. In one exemplary embodiment, processing device 210 may be a Programmable System on a Chip (PSoC™) processing device, manufactured by Cypress Semiconductor Corporation, San Jose, Calif. Alternatively, processing device 210 may be one or more other processing devices known by those of ordinary skill in the art, such as a microprocessor or central processing unit, a controller, special-purpose processor, digital signal processor (DSP), an application specific integrated circuit (ASIC), a field programmable gate array (FPGA), or the like. In an alternative embodiment, for example, the processing device may be a network processor having multiple processors including a core unit and multiple microengines. Additionally, the processing device may include any combination of general-purpose processing device(s) and special-purpose processing device(s).

Capacitance sensor 201 may be integrated into the IC of the processing device 210, or alternatively, in a separate IC. Alternatively, descriptions of capacitance sensor 201 may be generated and compiled for incorporation into other integrated circuits. For example, behavioral level code describing capacitance sensor 201, or portions thereof, may be generated using a hardware descriptive language, such as VHDL or Verilog, and stored to a machine-accessible medium (e.g., CD-ROM, hard disk, floppy disk, etc.). Furthermore, the behavioral level code can be compiled into register transfer level ("RTL") code, a netlist, or even a circuit layout and stored to a machine-accessible medium. The behavioral level code, the RTL code, the netlist, and the circuit layout all represent various levels of abstraction to describe capacitance sensor 201.

It should be noted that the components of electronic system 200 may include all the components described above. Alternatively, electronic system 200 may include only some of the components described above.

In one embodiment, electronic system 200 may be used in a notebook computer. Alternatively, the electronic device may be used in other applications, such as a mobile handset, a personal data assistant (PDA), a keyboard, a television, a remote control, a monitor, a handheld multi-media device, a handheld video player, a handheld gaming device, or a control panel.

In one embodiment, capacitance sensor 201 may be a capacitive switch relaxation oscillator (CSR). The CSR may have an array of capacitive touch switches using a current-programmable relaxation oscillator, an analog multiplexer, digital counting functions, and high-level software routines to compensate for environmental and physical switch variations. The switch array may include combinations of independent switches, sliding switches (e.g., touch-sensor slider), and touch-sensor pads implemented as a pair of orthogonal sliding switches. The CSR may include physical, electrical, and software components. The physical component may include the physical switch itself, typically a pattern constructed on a printed circuit board (PCB) with an insulating cover, a flexible membrane, or a transparent overlay. The electrical component may include an oscillator or other means to convert a changed capacitance into a measured signal. The electrical component may also include a counter or timer to measure the oscillator output. The software component may include detection and compensation software algorithms to convert the count value into a switch detection decision. For example, in the case of slide switches or X-Y touch-sensor pads, a calculation for finding position of the conductive object to greater resolution than the physical pitch of the switches may be used.

It should be noted that there are various known methods for measuring capacitance. Although the embodiments described herein are described using a relaxation oscillator, the present embodiments are not limited to using relaxation oscillators, but may include other methods, such as current versus voltage phase shift measurement, resistor-capacitor charge timing, capacitive bridge divider, charge transfer, or the like.

The current versus voltage phase shift measurement may include driving the capacitance through a fixed-value resistor to yield voltage and current waveforms that are out of phase by a predictable amount. The drive frequency can be adjusted to keep the phase measurement in a readily measured range. The resistor-capacitor charge timing may include charging the capacitor through a fixed resistor and measuring timing on the voltage ramp. Small capacitor values may require very large resistors for reasonable timing. The capacitive bridge divider may include driving the capacitor under test through a fixed reference capacitor. The reference capacitor and the capacitor under test form a voltage divider. The voltage signal is recovered with a synchronous demodulator, which may be done in the processing device 210. The charge transfer may be conceptually similar to an R-C charging circuit. In this method, $C_P$ is the capacitance being sensed. $C_{SUM}$ is the summing capacitor, into which charge is transferred on successive cycles. At the start of the measurement cycle, the voltage on $C_{SUM}$ is reset. The voltage on $C_{SUM}$ increases exponentially (and only slightly) with each clock cycle. The time for this voltage to reach a specific threshold is measured with a counter. Additional details regarding these alternative embodiments have not been included so as to not obscure the present embodiments, and because these alternative embodiments for measuring capacitance are known by those of ordinary skill in the art.

Figure 3A:
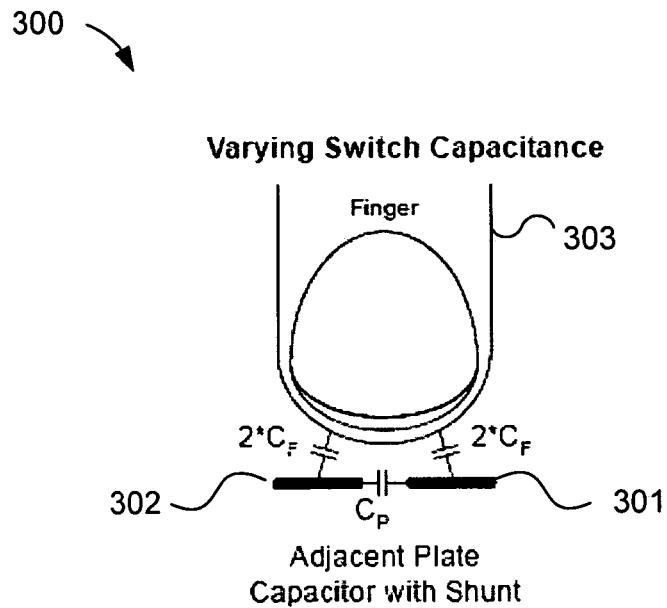
FIG. 3A illustrates a varying switch capacitance.

FIG. 3A illustrates a varying switch capacitance. In its basic form, a capacitive switch 300 is a pair of adjacent plates 301 and 302. There is a small edge-to-edge capacitance Cp, but the intent of switch layout is to minimize the base capacitance Cp between these plates. When a conductive object 303 (e.g., finger) is placed in proximity to the two plate 301 and 302, there is a capacitance 2*Cf between one electrode 301 and the conductive object 303 and a similar capacitance 2*Cf between the conductive object 303 and the other electrode 302. The capacitance between one electrode 301 and the conductive object 303 and back to the other electrode 302 adds in parallel to the base capacitance $C_P$ between the plates 301 and 302, resulting in a change of capacitance Cf. Capacitive switch 300 may be used in a capacitance switch array. The capacitance switch array is a set of capacitors where one side of each is grounded. Thus, the active capacitor (as represented in FIG. 3C as capacitor 351) has only one accessible side. The presence of the conductive object 303 increases the capacitance (Cp+Cf) of the switch 300 to ground. Determining switch activation is then a matter of measuring change in the capacitance (C0 or capacitance variation. Switch 300 is also known as a grounded variable capacitor. In one exemplary embodiment, Cf may range from approximately 10-30 picofarads (pF). Alternatively, other ranges may be used.

The conductive object in this case is a finger, alternatively, this technique may be applied to any conductive object, for example, a conductive door switch, position sensor, or conductive pen in a stylus tracking system (e.g., stylus).

Figure 3B:
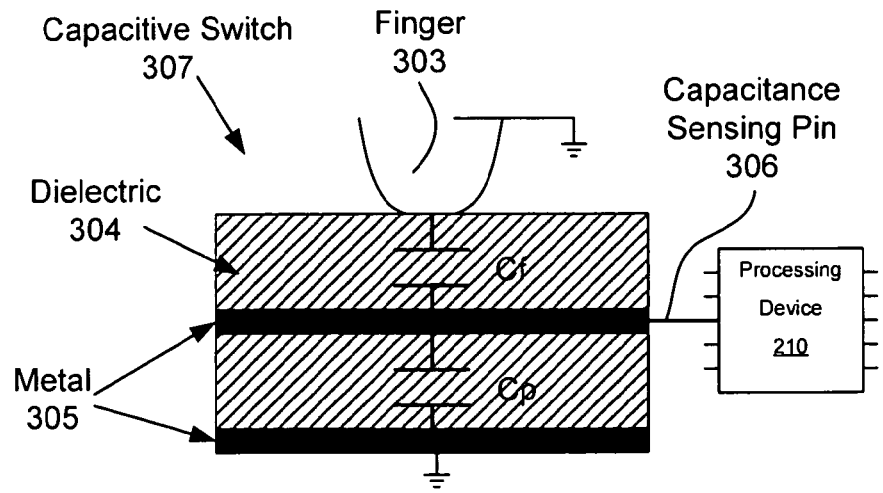
FIG. 3B illustrates one embodiment of a sensing device coupled to a processing device.
Figure 3C:
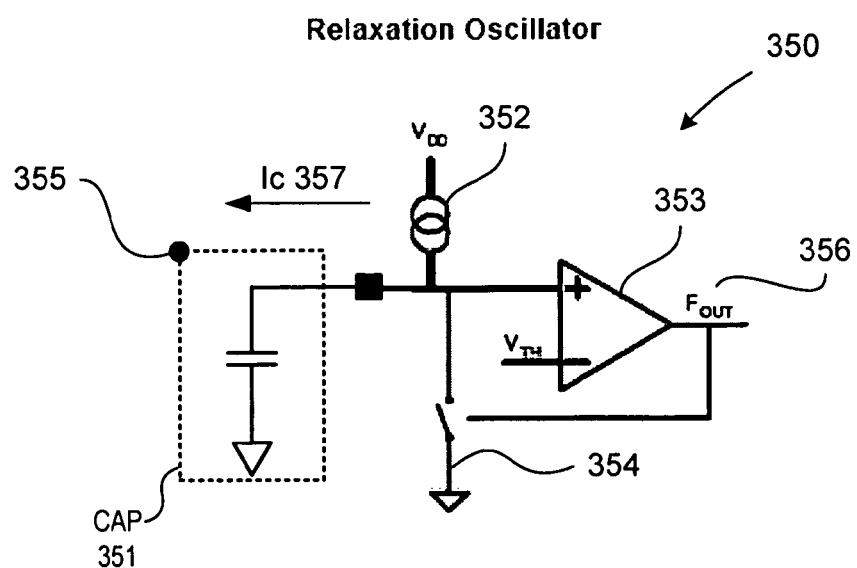
FIG. 3C illustrates one embodiment of a relaxation oscillator.

FIG. 3B illustrates one embodiment of a capacitive switch 307 coupled to a processing device 210. Capacitive switch 307 illustrates the capacitance as seen by the processing device 210 on the capacitance sensing pin 306. As previously described, when a conductive object 303 (e.g., finger) is placed in proximity to one of the metal plates 305, there is a capacitance, Cf, between the metal plate and the conductive object 303 with respect to ground. Also, there is a capacitance, Cp, between the two metal plates. Accordingly, the processing device 210 can measure the change in capacitance, capacitance variation Cf, as the conductive object is in proximity to the metal plate 305. Above and below the metal plate that is closest to the conductive object 303 is dielectric material 304. The dielectric material 304 above the metal plate 305 can be the overlay, as described in more detail below. The overlay may be non-conductive material used to protect the circuitry to environmental elements and to insulate the user's finger (e.g., conductive object) from the circuitry. Capacitance switch 307 may be a sensor element of a touch-sensor pad, a touch-sensor slider, or a touch-sensor button.

FIG. 3C illustrates one embodiment of a relaxation oscillator. The relaxation oscillator 350 is formed by the capacitance to be measured on capacitor 351, a charging current source 352, a comparator 353, and a reset switch 354. It should be noted that capacitor 351 is representative of the capacitance measured on a sensor element of a sensor array. The relaxation oscillator is coupled to drive a charging current (Ic) 357 in a single direction onto a device under test ("DUT") capacitor, capacitor 351. As the charging current piles charge onto the capacitor 351, the voltage across the capacitor increases with time as a function of Ic 357 and its capacitance C. Equation (1) describes the relation between current, capacitance, voltage and time for a charging capacitor.

$$CdV = I_c dt \quad (1)$$

The relaxation oscillator begins by charging the capacitor 351 from a ground potential or zero voltage and continues to pile charge on the capacitor 351 at a fixed charging current Ic 357 until the voltage across the capacitor 351 at node 355 reaches a reference voltage or threshold voltage, $V_{TH}$ 355. At $V_{TH}$ 355, the relaxation oscillator allows the accumulated charge at node 355 to discharge (e.g., the capacitor 351 to "relax" back to the ground potential) and then the process repeats itself. In particular, the output of comparator 353 asserts a clock signal $F_{OUT}$ 356 (e.g., $F_{OUT}$ 356 goes high), which enables the reset switch 354. This resets the voltage on the capacitor at node 355 to ground and the charge cycle starts again. The relaxation oscillator outputs a relaxation oscillator clock signal ($F_{OUT}$ 356) having a frequency ($f_{RO}$) dependent upon capacitance C of the capacitor 351 and charging current Ic 357.

The comparator trip time of the comparator 353 and reset switch 354 add a fixed delay. The output of the comparator 353 is synchronized with a reference system clock to guarantee that the comparator reset time is long enough to completely reset the charging voltage on capacitor 355. This sets a practical upper limit to the operating frequency. For example, if capacitance C of the capacitor 351 changes, then $f_{RO}$ will change proportionally according to Equation (1). By comparing $f_{RO}$ of $F_{OUT}$ 356 against the frequency ($f_{REF}$) of a known reference system clock signal (REF CLK), the change in capacitance ΔC can be measured. Accordingly, equations (2) and (3) below describe that a change in frequency between $F_{OUT}$ 356 and REF CLK is proportional to a change in capacitance of the capacitor 351.

$$\Delta C \propto \Delta f, \text{ where} \quad (2)$$

$$\Delta f = f_{RO} - f_{REF}. \quad (3)$$

In one embodiment, a frequency comparator may be coupled to receive relaxation oscillator clock signal ($F_{OUT}$ 356) and REF CLK, compare their frequencies $f_{RO}$ and $f_{REF}$, respectively, and output a signal indicative of the difference $\Delta f$ between these frequencies. By monitoring $\Delta f$ one can determine whether the capacitance of the capacitor 351 has changed.

In one exemplary embodiment, the relaxation oscillator 350 may be built using a programmable timer (e.g., 555 timer) to implement the comparator 353 and reset switch 354. Alternatively, the relaxation oscillator 350 may be built using other circuiting. Relaxation oscillators are known in by those of ordinary skill in the art, and accordingly, additional details regarding their operation have not been included so as to not obscure the present embodiments.

Figure 4:
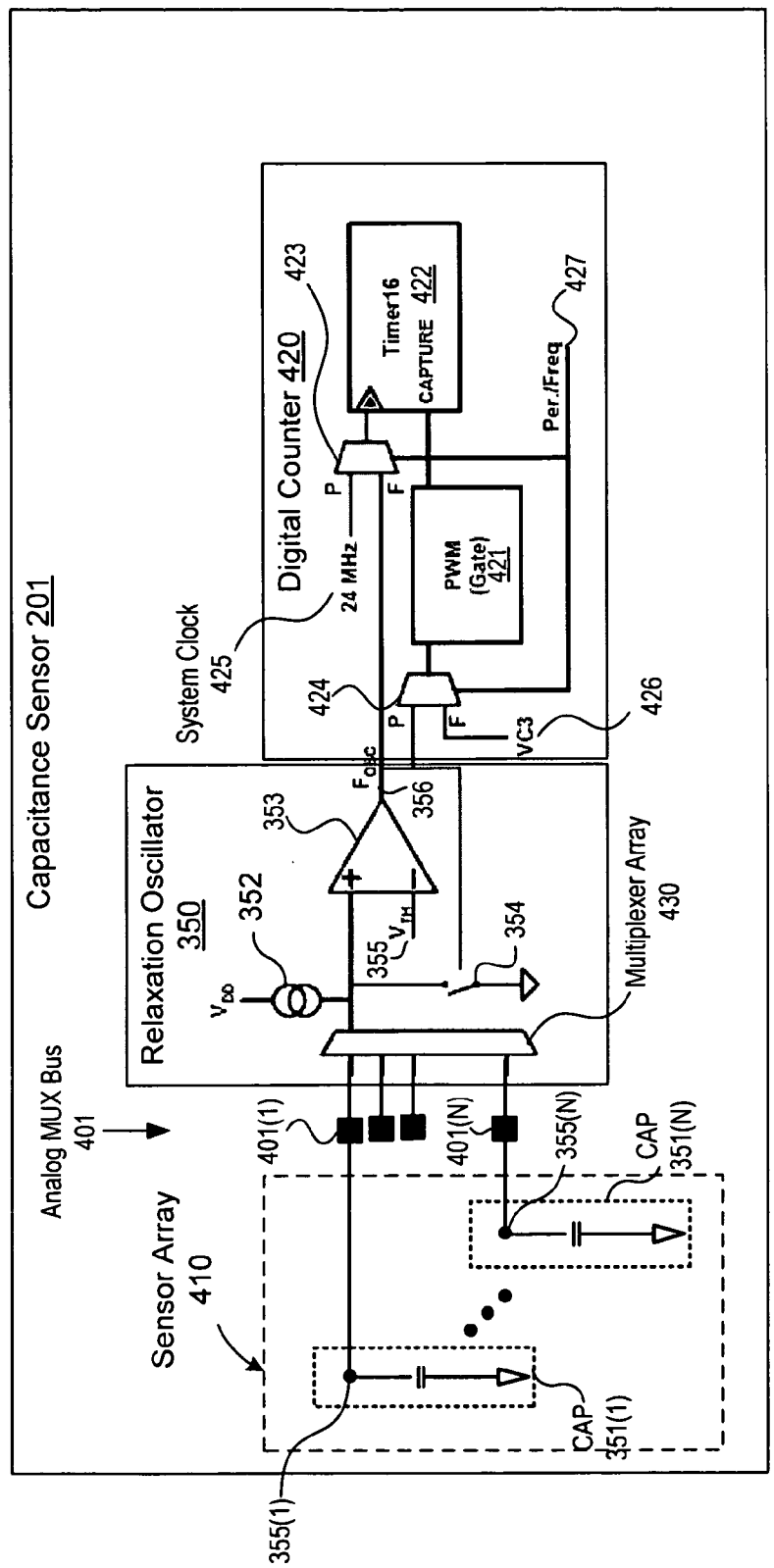
FIG. 4 illustrates a block diagram of one embodiment of a capacitance sensor including a relaxation oscillator and digital counter.

FIG. 4 illustrates a block diagram of one embodiment of a capacitance sensor including a relaxation oscillator and digital counter. Capacitance sensor 201 of FIG. 4 includes a sensor array 410 (also known as a switch array), relaxation oscillator 350, and a digital counter 420. Sensor array 410 includes a plurality of sensor elements 355(1)-355(N), where N is a positive integer value that represents the number of rows (or alternatively columns) of the sensor array 410. Each sensor element is represented as a capacitor, as previously described with respect to FIG. 3B. The sensor array 410 is coupled to relaxation oscillator 350 via an analog bus 401 having a plurality of pins 401(1)-401(N). In one embodiment, the sensor array 410 may be a single-dimension sensor array including the sensor elements 355(1)-355(N), where N is a positive integer value that represents the number of sensor elements of the single-dimension sensor array. The single-dimension sensor array 410 provides output data to the analog bus 401 of the processing device 210 (e.g., via lines 231). Alternatively, the sensor array 410 may be a multi-dimension sensor array including the sensor elements 355(1)-355(N), where N is a positive integer value that represents the number of sensor elements of the multi-dimension sensor array. The multi-dimension sensor array 410 provides output data to the analog bus 401 of the processing device 210 (e.g., via bus 221).

Relaxation oscillator 350 of FIG. 4 includes all the components described with respect to FIG. 3C, and a selection circuit 430. The selection circuit 430 is coupled to the plurality of sensor elements 355(1)-355(N), the reset switch 354, the current source 352, and the comparator 353. Selection circuit 430 may be used to allow the relaxation oscillator 350 to measure capacitance on multiple sensor elements (e.g., rows or columns). The selection circuit 430 may be configured to sequentially select a sensor element of the plurality of sensor elements to provide the charge current and to measure the capacitance of each sensor element. In one exemplary embodiment, the selection circuit 430 is a multiplexer array of the relaxation oscillator 350. Alternatively, selection circuit may be other circuitry outside the relaxation oscillator 350, or even outside the capacitance sensor 201 to select the sensor element to be measured. Capacitance sensor 201 may include one relaxation oscillator and digital counter for the plurality of sensor elements of the sensor array. Alternatively, capacitance sensor 201 may include multiple relaxation oscillators and digital counters to measure capacitance on the plurality of sensor elements of the sensor array. The multiplexer array may also be used to ground the sensor elements that are not being measured. This may be done in conjunction with a dedicated pin in the GP10 port 207.

In another embodiment, the capacitance sensor 201 may be configured to simultaneously scan the sensor elements, as opposed to being configured to sequentially scan the sensor elements as described above. For example, the sensing device may include a sensor array having a plurality of rows and columns. The rows may be scanned simultaneously, and the columns may be scanned simultaneously.

In one exemplary embodiment, the voltages on all of the rows of the sensor array are simultaneously moved, while the voltages of the columns are held at a constant voltage, with the complete set of sampled points simultaneously giving a profile of the conductive object in a first dimension. Next, the voltages on all of the rows are held at a constant voltage, while the voltages on all the rows are simultaneously moved, to obtain a complete set of sampled points simultaneously giving a profile of the conductive object in the other dimension.

In another exemplary embodiment, the voltages on all of the rows of the sensor array are simultaneously moved in a positive direction, while the voltages of the columns are moved in a negative direction. Next, the voltages on all of the rows of the sensor array are simultaneously moved in a negative direction, while the voltages of the columns are moved in a positive direction. This technique doubles the effect of any transcapacitance between the two dimensions, or conversely, halves the effect of any parasitic capacitance to the ground. In both methods, the capacitive information from the sensing process provides a profile of the presence of the conductive object to the sensing device in each dimension. Alternatively, other methods for scanning known by those of ordinary skill in the art may be used to scan the sensing device.

Digital counter 420 is coupled to the output of the relaxation oscillator 350. Digital counter 420 receives the relaxation oscillator output signal 356 ($F_{OUT}$). Digital counter 420 is configured to count at least one of a frequency or a period of the relaxation oscillator output received from the relaxation oscillator.

As previously described with respect to the relaxation oscillator 350, when a finger or conductive object is placed on the switch, the capacitance increases from Cp to Cp+Cf so the relaxation oscillator output signal 356 ($F_{OUT}$) decreases. The relaxation oscillator output signal 356 ($F_{OUT}$) is fed to the digital counter 420 for measurement. There are two methods for counting the relaxation oscillator output signal 356, frequency measurement and period measurement. In one embodiment, the digital counter 420 may include two multiplexers 423 and 424. Multiplexers 423 and 424 are configured to select the inputs for the PWM 421 and the timer 422 for the two measurement methods, frequency and period measurement methods. Alternatively, other selection circuits may be used to select the inputs for the PWM 421 and the time 422. In another embodiment, multiplexers 423 and 424 are not included in the digital counter, for example, the digital counter 420 may be configured in one, or the other, measurement configuration.

In the frequency measurement method, the relaxation oscillator output signal 356 is counted for a fixed period of time. The counter 422 is read to obtain the number of counts during the gate time. This method works well at low frequencies where the oscillator reset time is small compared to the oscillator period. A pulse width modulator (PWM) 441 is clocked for a fixed period by a derivative of the system clock, VC3 426 (which is a divider from system clock 425, e.g., 24 MHz). Pulse width modulation is a modulation technique that generates variable-length pulses to represent the amplitude of an analog input signal; in this case VC3 426. The output of PWM 421 enables timer 422 (e.g., 16-bit). The relaxation oscillator output signal 356 clocks the timer 422. The timer 422 is reset at the start of the sequence, and the count value is read out at the end of the gate period.

In the period measurement method, the relaxation oscillator output signal 356 gates a counter 422, which is clocked by the system clock 425 (e.g., 24 MHz). In order to improve sensitivity and resolution, multiple periods of the oscillator are counted with the PWM 421. The output of PWM 421 is used to gate the timer 422. In this method, the relaxation oscillator output signal 356 drives the clock input of PWM 421. As previously described, pulse width modulation is a modulation technique that generates variable-length pulses to represent the amplitude of an analog input signal; in this case the relaxation oscillator output signal 356. The output of the PWM 421 enables timer 422 (e.g., 16-bit), which is clocked at the system clock frequency 425 (e.g., 24 MHz). When the output of PWM 421 is asserted (e.g., goes high), the count starts by releasing the capture control. When the terminal count of the PWM 421 is reached, the capture signal is asserted (e.g., goes high), stopping the count and setting the PWM's interrupt. The timer value is read in this interrupt. The relaxation oscillator 350 is indexed to the next switch (e.g., capacitor 351(2)) to be measured and the count sequence is started again.

The two counting methods may have equivalent performance in sensitivity and signal-to-noise ratio (SNR). The period measurement method may have a slightly faster data acquisition rate, but this rate is dependent on software loads and the values of the switch capacitances. The frequency measurement method has a fixed-switch data acquisition rate.

The length of the counter 422 and the detection time required for the switch are determined by sensitivity requirements. Small changes in the capacitance on capacitor 351 result in small changes in frequency. In order to find these small changes, it may be necessary to count for a considerable time.

At startup (or boot) the switches (e.g., capacitors 351(1)-(N)) are scanned and the count values for each switch with no actuation are stored as a baseline array (Cp). The presence of a finger on the switch is determined by the difference in counts between a stored value for no switch actuation and the acquired value with switch actuation, referred to here as Δn. The sensitivity of a single switch is approximately:

$$\frac{\Delta n}{n} = \frac{Cf}{Cp} \quad (4)$$

The value of Δn should be large enough for reasonable resolution and clear indication of switch actuation. This drives switch construction decisions.

Cf should be as large a fraction of Cp as possible. In one exemplary embodiment, the fraction of Cf/Cp ranges between approximately 0.01 to approximately 2.0. Alternatively, other fractions may be used for Cf/Cp. Since Cf is determined by finger area and distance from the finger to the switch's conductive traces (through the over-lying insulator), the baseline capacitance Cp should be minimized. The baseline capacitance Cp includes the capacitance of the switch pad plus any parasitics, including routing and chip pin capacitance.

In switch array applications, variations in sensitivity should be minimized. If there are large differences in Δn, one switch may actuate at 1.0 cm, while another may not actuate until direct contact. This presents a non-ideal user interface device. There are numerous methods for balancing the sensitivity. These may include precisely matching on-board capacitance with PC trace length modification, adding balance capacitors on each switch's PC board trace, and/or adapting a calibration factor to each switch to be applied each time the switch is tested.

In one embodiment, the PCB design may be adapted to minimize capacitance, including thicker PCBs where possible. In one exemplary embodiment, a 0.062 inch thick PCB is used. Alternatively, other thicknesses may be used, for example, a 0.015 inch thick PCB.

It should be noted that the count window should be long enough for Δn to be a "significant number." In one embodiment, the "significant number" can be as little as 10, or alternatively, as much as several hundred. In one exemplary embodiment, where Cf is 1.0% of Cp (a typical "weak" switch), and where the switch threshold is set at a count value of 20, n is found to be:

$$n = \Delta n \cdot \frac{Cf}{Cp} = 2000 \quad (5)$$

Adding some margin to yield 2500 counts, and running the frequency measurement method at 1.0 MHz, the detection time for the switch is 2.5 microseconds. In the frequency measurement method, the frequency difference between a switch with and without actuation (i.e., CP+CF vs. CP) is approximately:

$$\Delta n = \frac{t_{count} \cdot i_c}{V_{TH}} \frac{Cf}{C_p^2} \quad (6)$$

This shows that the sensitivity variation between one channel and another is a function of the square of the difference in the two channels' static capacitances. This sensitivity difference can be compensated using routines in the high-level Application Programming Interfaces (APIs).

In the period measurement method, the count difference between a switch with and without actuation (i.e., CP+CF vs. CP) is approximately:

$$\Delta n = N_{Periods} \cdot \frac{Cf \cdot V_{TH}}{i_C} \cdot f_{sysClk} \quad (7)$$

The charge currents are typically lower and the period is longer to increase sensitivity, or the number of periods for which $f_{SysClk}$ is counted can be increased. In either method, by matching the static (parasitic) capacitances Cp of the individual switches, the repeatability of detection increases, making all switches work approximately at the same difference. Compensation for this variation can be done in software at runtime. The compensation algorithms for both the frequency method and period method may be included in the high-level APIs.

Some implementations of this circuit use a current source programmed by a fixed-resistor value. If the range of capacitance to be measured changes, external components, (i.e., the resistor) should be adjusted.

Using the multiplexer array 430, multiple sensor elements may be sequentially scanned to provide current to and measure the capacitance from the capacitors (e.g., sensor elements), as previously described. In other words, while one sensor element is being measured, the remaining sensor elements are grounded using the GPIO port 207. This drive and multiplex arrangement bypasses the existing GPIO to connect the selected pin to an internal analog multiplexer (mux) bus. The capacitor charging current (e.g., current source 352) and reset switch 353 are connected to the analog mux bus. This may limit the pin-count requirement to simply the number of switches (e.g., capacitors 351(1)-351(N)) to be addressed. In one exemplary embodiment, no external resistors or capacitors are required inside or outside the processing device 210 to enable operation.

The capacitor charging current for the relaxation oscillator 350 is generated in a register programmable current output DAC (also known as IDAC). Accordingly, the current source 352 is a current DAC or IDAC. The IDAC output current may be set by an 8-bit value provided by the processing device 210, such as from the processing core 202. The 8-bit value may be stored in a register or in memory.

Estimating and measuring PCB capacitances may be difficult; the oscillator-reset time may add to the oscillator period (especially at higher frequencies); and there may be some variation to the magnitude of the IDAC output current with operating frequency. Accordingly, the optimum oscillation frequency and operating current for a particular switch array may be determined to some degree by experimentation.

In many capacitive switch designs the two "plates" (e.g., 301 and 302) of the sensing capacitor are actually adjacent sensor elements that are electrically isolated (e.g., PCB pads or traces), as indicated in FIG. 3A. Typically, one of these plates is grounded. Layouts for touch-sensor slider (e.g., linear slide switches) and touch-sensor pad applications have switches that are immediately adjacent. In this case, all of the switches that are not active are grounded through the GPIO 207 of the processing device 210 dedicated to that pin. The actual capacitance between adjacent plates is small (Cp), but the capacitance of the active plate (and its PCB trace back to the processing device 210) to ground, when detecting the presence of the conductive object 303, may be considerably higher (Cp+Cf). The capacitance of two parallel plates is given by the following equation:

$$C = \varepsilon_0 \cdot \varepsilon_R \cdot \frac{A}{d} = \varepsilon_R \cdot 8.85 \cdot \frac{A}{d} pF/m \quad (8)$$

The dimensions of equation (8) are in meters. This is a very simple model of the capacitance. The reality is that there are fringing effects that substantially increase the switch-to-ground (and PCB trace-to-ground) capacitance.

Switch sensitivity (i.e., actuation distance) may be increased by one or more of the following: 1) increasing board thickness to increase the distance between the active switch and any parasitics; 2) minimizing PC trace routing underneath switches; 3) utilizing a grided ground with 50% or less fill if use of a ground plane is absolutely necessary; 4) increasing the spacing between switch pads and any adjacent ground plane; 5) increasing pad area; 6) decreasing thickness of any insulating overlay; or 7) verifying that there is no air-gap between the PC pad surface and the touching finger.

There is some variation of switch sensitivity as a result of environmental factors. A baseline update routine, which compensates for this variation, may be provided in the high-level APIs.

Sliding switches are used for control requiring gradual adjustments. Examples include a lighting control (dimmer), volume control, graphic equalizer, and speed control. These switches are mechanically adjacent to one another. Actuation of one switch results in partial actuation of physically adjacent switches. The actual position in the sliding switch is found by computing the centroid location of the set of switches activated.

In applications for touch-sensor sliders (e.g., sliding switches) and touch-sensor pads it is often necessary to determine finger (or other capacitive object) position to more resolution than the native pitch of the individual switches. The contact area of a finger on a sliding switch or a touch-pad is often larger than any single switch. In one embodiment, in order to calculate the interpolated position using a centroid, the array is first scanned to verify that a given switch location is valid. The requirement is for some number of adjacent switch signals to be above a noise threshold. When the strongest signal is found, this signal and those immediately adjacent are used to compute a centroid:

$$\text{Centroid} = \frac{n_{i-1} \cdot (i-1) + n_i i + n_{i+1} \cdot (i+1)}{n_{i-1} + n_i i + n_{i+1}} \quad (9)$$

The calculated value will almost certainly be fractional. In order to report the centroid to a specific resolution, for example a range of 0 to 100 for 12 switches, the centroid value may be multiplied by a calculated scalar. It may be more efficient to combine the interpolation and scaling operations into a single calculation and report this result directly in the desired scale. This may be handled in the high-level APIs. Alternatively, other methods may be used to interpolate the position of the conductive object.

A physical touchpad assembly is a multi-layered module to detect a conductive object. In one embodiment, the multi-layer stack-up of a touchpad assembly includes a PCB, an adhesive layer, and an overlay. The PCB includes the processing device 210 and other components, such as the connector to the host 250, necessary for operations for sensing the capacitance. These components are on the non-sensing side of the PCB. The PCB also includes the sensor array on the opposite side, the sensing side of the PCB. Alternatively, other multi-layer stack-ups may be used in the touchpad assembly.

The PCB may be made of standard materials, such as FR4 or Kapton™ (e.g., flexible PCB). In either case, the processing device 210 may be attached (e.g., soldered) directly to the sensing PCB (e.g., attached to the non-sensing side of the PCB). The PCB thickness varies depending on multiple variables, including height restrictions and sensitivity requirements. In one embodiment, the PCB thickness is at least approximately 0.3 millimeters (mm). Alternatively, the PCB may have other thicknesses. It should be noted that thicker PCBs may yield better results. The PCB length and width is dependent on individual design requirements for the device on which the sensing device is mounted, such as a notebook or mobile handset.

The adhesive layer is directly on top of the PCB sensing array and is used to affix the overlay to the overall touchpad assembly. Typical material used for connecting the overlay to the PCB is non-conductive adhesive such as 3M 467 or 468. In one exemplary embodiment, the adhesive thickness is approximately 0.05 mm. Alternatively, other thicknesses may be used.

The overlay may be non-conductive material used to protect the PCB circuitry to environmental elements and to insulate the user's finger (e.g., conductive object) from the circuitry. Overlay can be ABS plastic, polycarbonate, glass, or Mylar™. Alternatively, other materials known by those of ordinary skill in the art may be used. In one exemplary embodiment, the overlay has a thickness of approximately 1.0 mm. In another exemplary embodiment, the overlay thickness has a thickness of approximately 2.0 mm. Alternatively, other thicknesses may be used.

The sensor array may be a grid-like pattern of sensor elements (e.g., capacitive elements) used in conjunction with the processing device 210 to detect a presence of a conductive object, such as finger, to a resolution greater than that which is native. The touch-sensor pad layout pattern maximizes the area covered by conductive material, such as copper, in relation to spaces necessary to define the rows and columns of the sensor array.

Figure 5A:
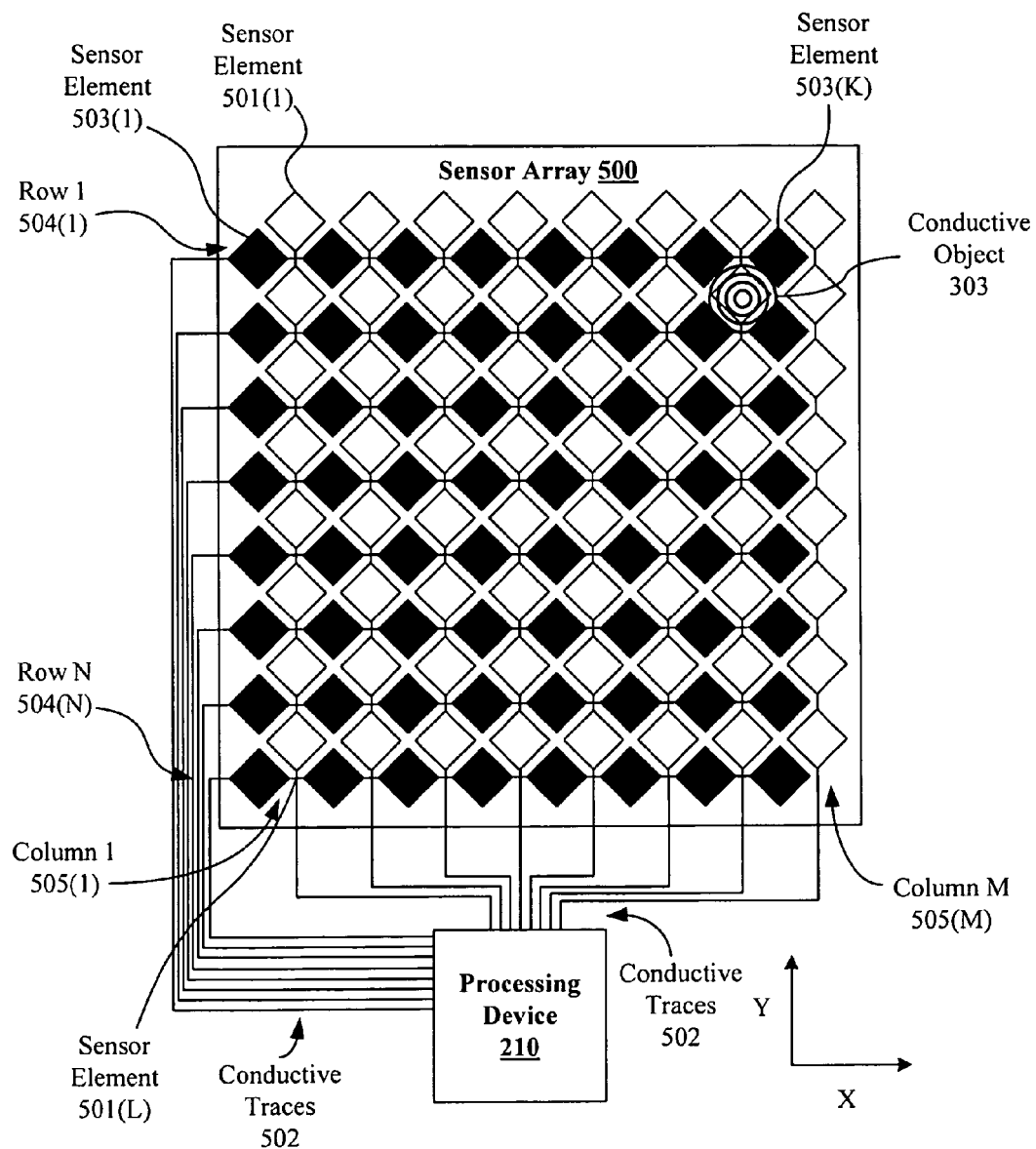
FIG. 5A illustrates a top-side view of one embodiment of a sensor array having a plurality of sensor elements for detecting a presence of a conductive object on the sensor array of a touch-sensor pad.

FIG. 5A illustrates a top-side view of one embodiment of a sensor array having a plurality of sensor elements for detecting a presence of a conductive object 303 on the sensor array 500 of a touch-sensor pad. Touch-sensor pad 220 includes a sensor array 500. Sensor array 500 includes a plurality of rows 504(1)-504(N) and a plurality of columns 505(1)-505(M), where N is a positive integer value representative of the number of rows and M is a positive integer value representative of the number of columns. Each row includes a plurality of sensor elements 503(1)-503(K), where K is a positive integer value representative of the number of sensor elements in the row. Each column includes a plurality of sensor elements 501(1)-501(L), where L is a positive integer value representative of the number of sensor elements in the column. Accordingly, sensor array is an N×M sensor matrix. The N×M sensor matrix, in conjunction with the processing device 210, is configured to detect a position of a presence of the conductive object 303 in the x-, and y-directions.

Figure 5B:
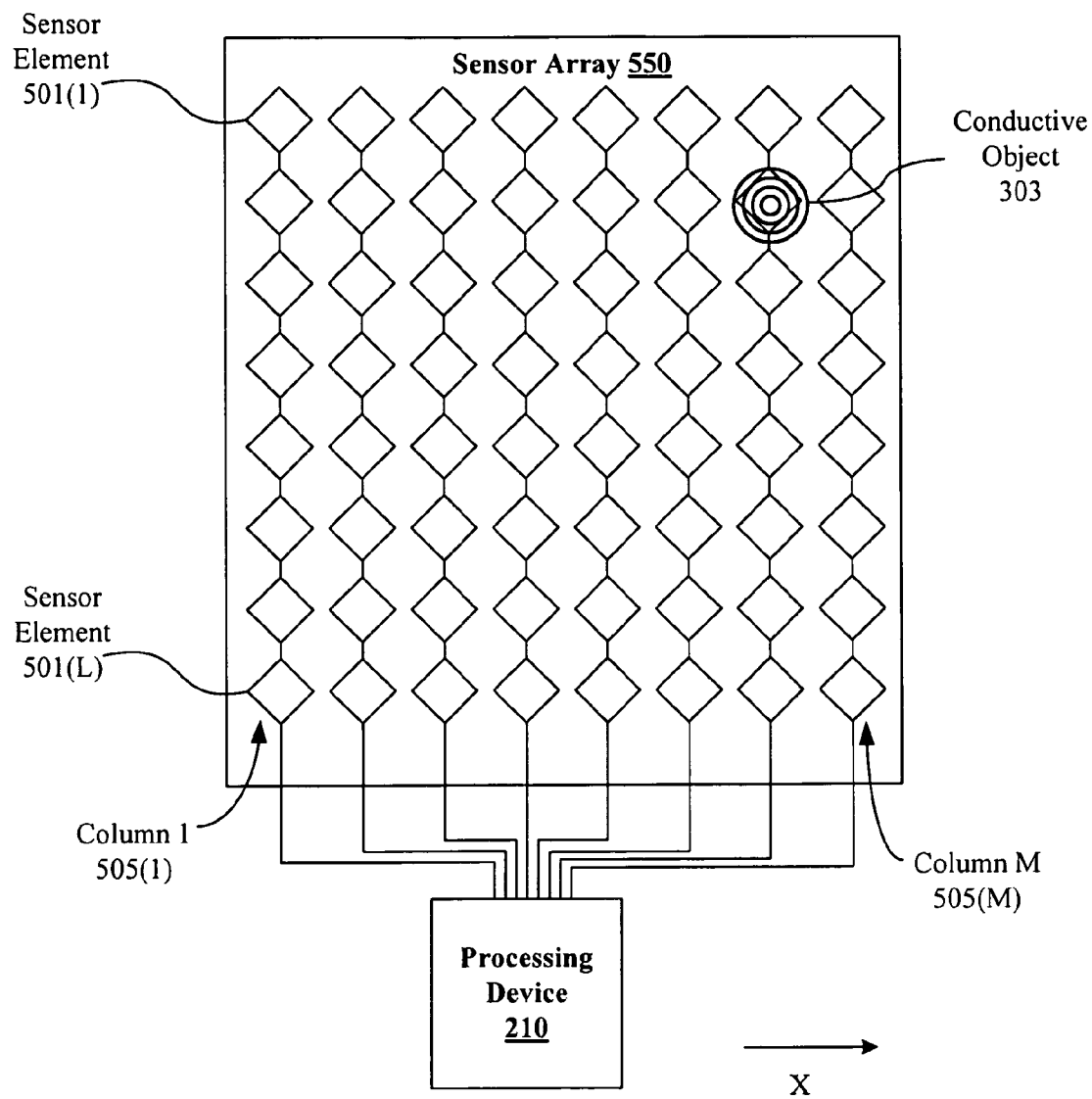
FIG. 5B illustrates a top-side view of one embodiment of a sensor array having a plurality of sensor elements for detecting a presence of a conductive object on the sensor array of a touch-sensor slider.

FIG. 5B illustrates a top-side view of one embodiment of a sensor array having a plurality of sensor elements for detecting a presence of a conductive object 303 on the sensor array 550 of a touch-sensor slider. Touch-sensor slider 230 includes a sensor array 550. Sensor array 550 includes a plurality of columns 504(1)-504(M), where M is a positive integer value representative of the number of columns. Each column includes a plurality of sensor elements 501(1)-501(L), where L is a positive integer value representative of the number of sensor elements in the column. Accordingly, sensor array is a 1×M sensor matrix. The 1×M sensor matrix, in conjunction with the processing device 210, is configured to detect a position of a presence of the conductive object 303 in the x-direction. It should be noted that sensor array 500 may be configured to function as a touch-sensor slider 230.

Alternating columns in FIG. 5A correspond to x- and y-axis elements. The y-axis sensor elements 503(1)-503(K) are illustrated as black diamonds in FIG. 5A, and the x-axis sensor elements 501(1)-501(L) are illustrated as white diamonds in FIG. 5A and FIG. 5B. It should be noted that other shapes may be used for the sensor elements. In another embodiment, the columns and row may include vertical and horizontal bars (e.g., rectangular shaped bars); however, this design may include additional layers in the PCB to allow the vertical and horizontal bars to be positioned on the PCB so that they are not in contact with one another.

Figure 5C:
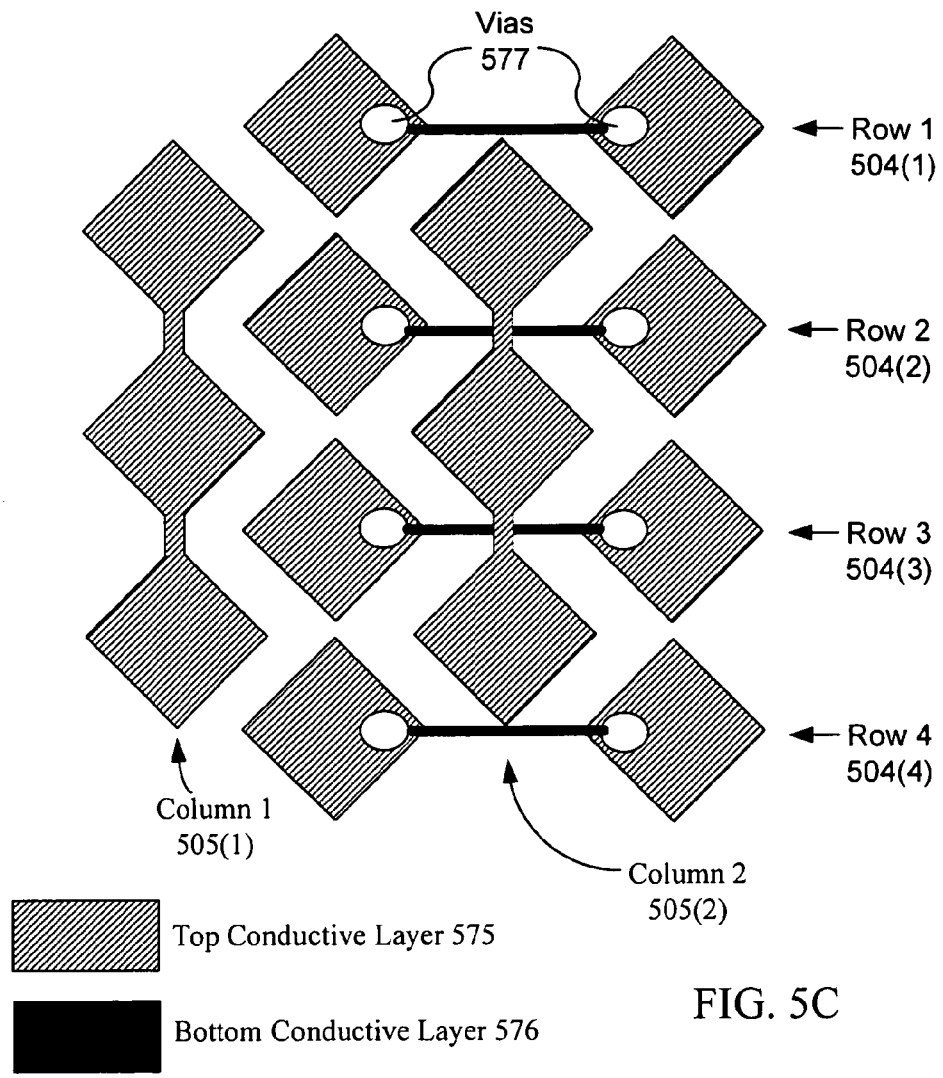
FIG. 5C illustrates a top-side view of one embodiment of a two-layer touch-sensor pad.
Figure 5D:
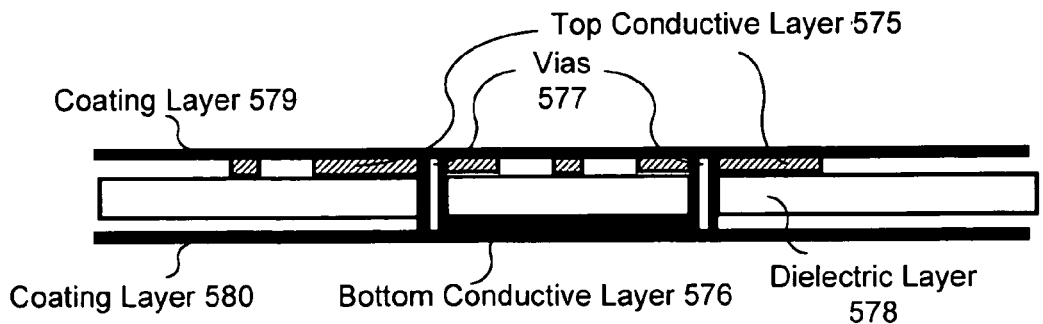
FIG. 5D illustrates a side view of one embodiment of the two-layer touch-sensor pad of FIG. 5C.

FIGS. 5C and 5D illustrate top-side and side views of one embodiment of a two-layer touch-sensor pad. Touch-sensor pad, as illustrated in FIGS. 5C and 5D, include the first two columns 505(1) and 505(2), and the first four rows 504(1)-504(4) of sensor array 500. The sensor elements of the first column 501(1) are connected together in the top conductive layer 575, illustrated as hashed diamond sensor elements and connections. The diamond sensor elements of each column, in effect, form a chain of elements. The sensor elements of the second column 501(2) are similarly connected in the top conductive layer 575. The sensor elements of the first row 504(1) are connected together in the bottom conductive layer 575 using vias 577, illustrated as black diamond sensor elements and connections. The diamond sensor elements of each row, in effect, form a chain of elements. The sensor elements of the second, third, and fourth rows 504(2)-504(4) are similarly connected in the bottom conductive layer 576.

As illustrated in FIG. 5D, the top conductive layer 575 includes the sensor elements for both the columns and the rows of the sensor array, as well as the connections between the senor elements of the columns of the sensor array. The bottom conductive layer 576 includes the conductive paths that connect the sensor elements of the rows that reside in the top conductive layer 575. The conductive paths between the sensor elements of the rows use vias 577 to connect to one another in the bottom conductive layer 576. Vias 577 go from the top conductive layer 575, through the dielectric layer 578, to the bottom conductive layer 576. Coating layers 579 and 589 are applied to the surfaces opposite to the surfaces that are coupled to the dielectric layer 578 on both the top and bottom conductive layers 575 and 576.

It should be noted that the space between coating layers 579 and 589 and dielectric layer 578, which does not include any conductive material, may be filled with the same material as the coating layers or dielectric layer. Alternatively, it may be filled with other materials.

It should be noted that the present embodiments are not be limited to connecting the sensor elements of the rows using vias to the bottom conductive layer 576, but may include connecting the sensor elements of the columns using vias to the bottom conductive layer 576. Furthermore, the present embodiments are not limited two-layer configurations, but may include disposing the sensor elements on multiple layers, such as three- or four-layer configurations.

When pins are not being sensed (only one pin is sensed at a time), they are routed to ground. By surrounding the sensing device (e.g., touch-sensor pad) with a ground plane, the exterior elements have the same fringe capacitance to ground as the interior elements.

In one embodiment, an IC including the processing device 210 may be directly placed on the non-sensor side of the PCB. This placement does not necessary have to be in the center. The processing device IC is not required to have a specific set of dimensions for a touch-sensor pad, nor a certain number of pins. Alternatively, the IC may be placed somewhere external to the PCB.

Figure 6A:
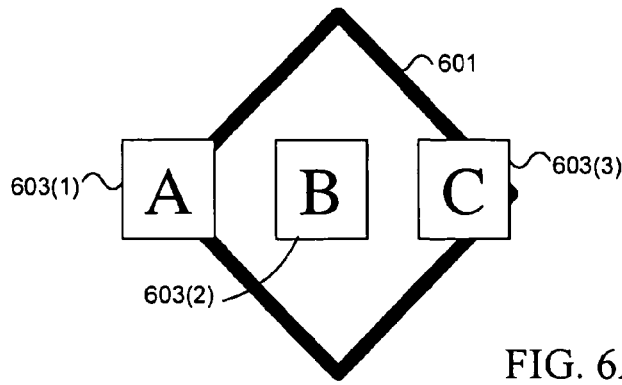
FIG. 6A illustrates one embodiment of a single sensor element of a sensing device that has three keyboard keys assigned to pre-defined areas of the sensing device.
Figure 6B:
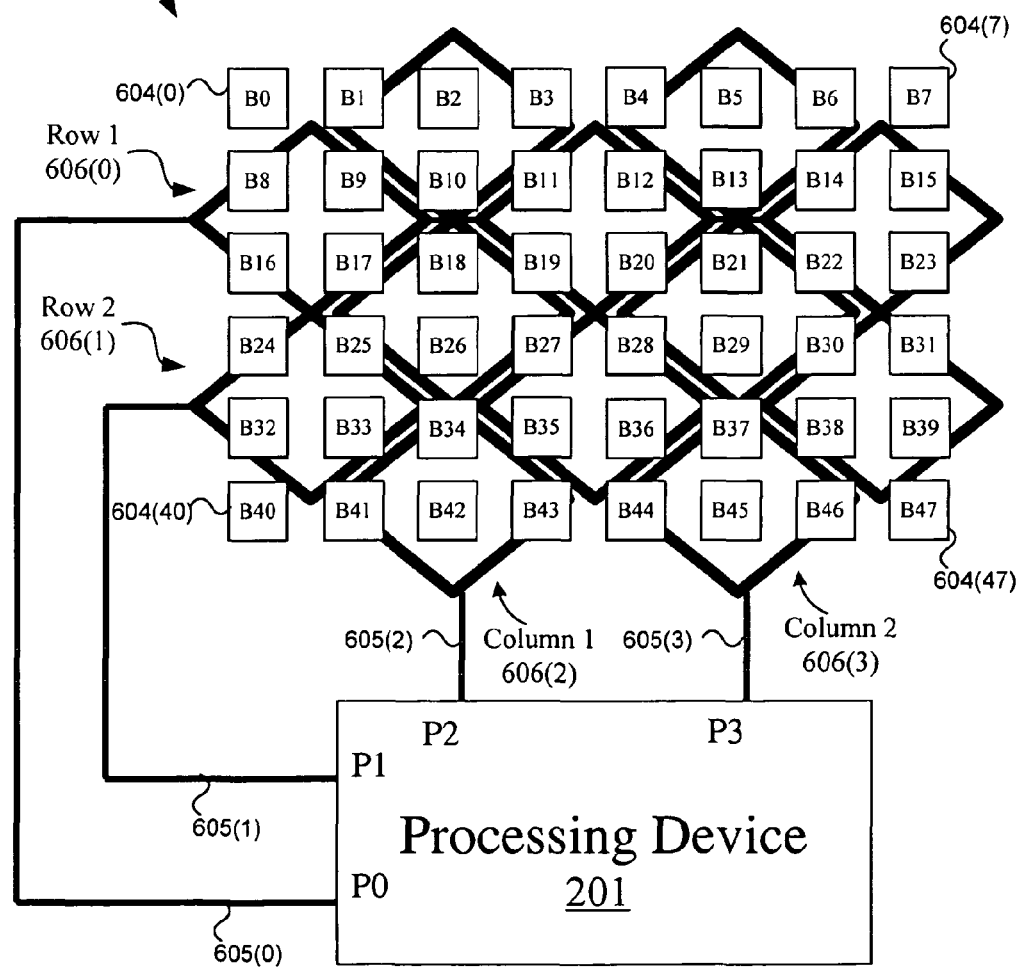
FIG. 6B illustrates one embodiment of a processing device coupled to a sensing device that has a capacitance sensor matrix and multiple keyboard keys assigned to pre-defined areas of the sensing device.

FIG. 6A illustrates one embodiment of a single sensor element of a sensing device that has three keyboard keys assigned to pre-defined areas of the sensing device. Sensor element 601 is a diamond-shaped sensor element of a sensing device. Keyboard keys, A-C 603(1)-603(3), are assigned pre-defined areas of the sensing device. In this embodiment, the keyboard keys 603(1)-603(3) correspond to pre-defined areas that are disposed in a horizontal line along a center line of the diamond-shaped sensor element, sensor element 601. Alternatively, the pre-defined areas of keyboard keys 603(1)-603(3) may be disposed in other configurations on the sensing device. It should be noted that the gaps between the pre-defined areas (represented as square buttons) are merely for illustration and description purposes, and accordingly, the keyboard keys may be assigned adjacent to one another without any space between the keyboard keys.

In one embodiment, the keyboard keys may be assigned to pre-defined areas of the sensing area using a data structure. For example, the data structure may be a key-mapping data structure. The data structure may include positional data of the pre-defined areas of the keyboard keys. The positional data may be the x- and y-coordinate ranges of the pre-defined areas of the keyboard keys. Accordingly, after the location of the conductive object that is present on the sensing device is determined, the position of the conductive object may be compared with the positional data of the pre-defined areas of the data structure to determine which keyboard key has been pressed. After determining which keyboard key has been pressed, the keyboard data that corresponds to the pressed key can be sent to a host or other component that is external to the processing device. In one embodiment, the data structure may be pre-determined and stored in memory of the processing device. The data structure may be a look-up table. Alternatively the data structure may be defined during operation of the processing device. This may be used to calibrate the pre-defined areas of the sensing device.

Sensor element 601 may be coupled to additional sensor elements in the sensing device, such as to other sensor elements in the same row or column. Furthermore, it should be noted that the embodiments described herein are not limited to being diamond shaped, but may include other shapes, such hexagons, octagons, squares, rectangles, triangles, circles, ovals, or the like.

FIG. 6B illustrates one embodiment of a processing device 210 coupled to a sensing device that has a capacitance sensor matrix 600 and multiple keyboard keys 604(0)-604(47) assigned to pre-defined areas of the sensing device. Capacitance sensor matrix 600 includes two rows 606(0) and 606(1) and two columns 606(2) and 606(3). Both the rows and columns have 3 sensor elements each. Row 606(0) and 606(1) are coupled to processing device 210 using capacitance sensing pins 605(0) and 605(1), respectively. Column 606(2) and 606(3) are coupled to processing device 210 using capacitance sensing pins 605(2) and 605(3), respectively. Keyboard keys 604(0)-604(47) are assigned to pre-defined areas of the sensing device. In particular, keyboard key B0 is assigned to be in the upper-left most keyboard key of the sensor matrix 600, and the keyboard key B47 is assigned to be in the lower-right most keyboard key of the sensor matrix 600. These keyboard keys may be assigned to represent different keyboard keys, such as alphanumeric characters, function keys, and the like.

As previously described, after the keyboard keys have been assigned a pre-defined area of the sensing device, a presence of a conductive object can be detected on the sensing device. The processing device determines the position of the presence of the conductive object, and selects which keyboard key has been pressed based on the pre-defined areas and the position of the presence of the conductive object. Selecting the keyboard may include comparing the position with the pre-defined areas. Once the keyboard key has been selected, the processing device may output keyboard data that corresponds to the selected key to a component external to the processing device. The component may be a processor, a driver of a processor, or an embedded controller.

In one embodiment, the position of the presence of the conductive object may be determined by measuring a capacitance (e.g., or capacitance variation) of each row (e.g., 606(0) and 606(1)) of sensor elements of the capacitance sensor matrix 600, and determining a first dimension position (e.g., y-coordinate location) based on the measured capacitance of the rows of sensor elements. Similarly, a capacitance of each column (e.g., 606(2) and 606(3)) of sensor elements of the capacitance sensor matrix 600 can be measured to determine a second dimension position (e.g., x-coordinate location) based on the measured capacitance of the columns of sensor elements. The position of the detected presence of the conductive object is determined using the first and second dimension positions.

As described above, the keyboard keys 604(0)-604(47) can be assigned to pre-defined areas using a data structure. After determining the position of the conductive object, the processing device can compare the position with the pre-defined areas of the data structure to select which keyboard key has been pressed.

Figure 6C:
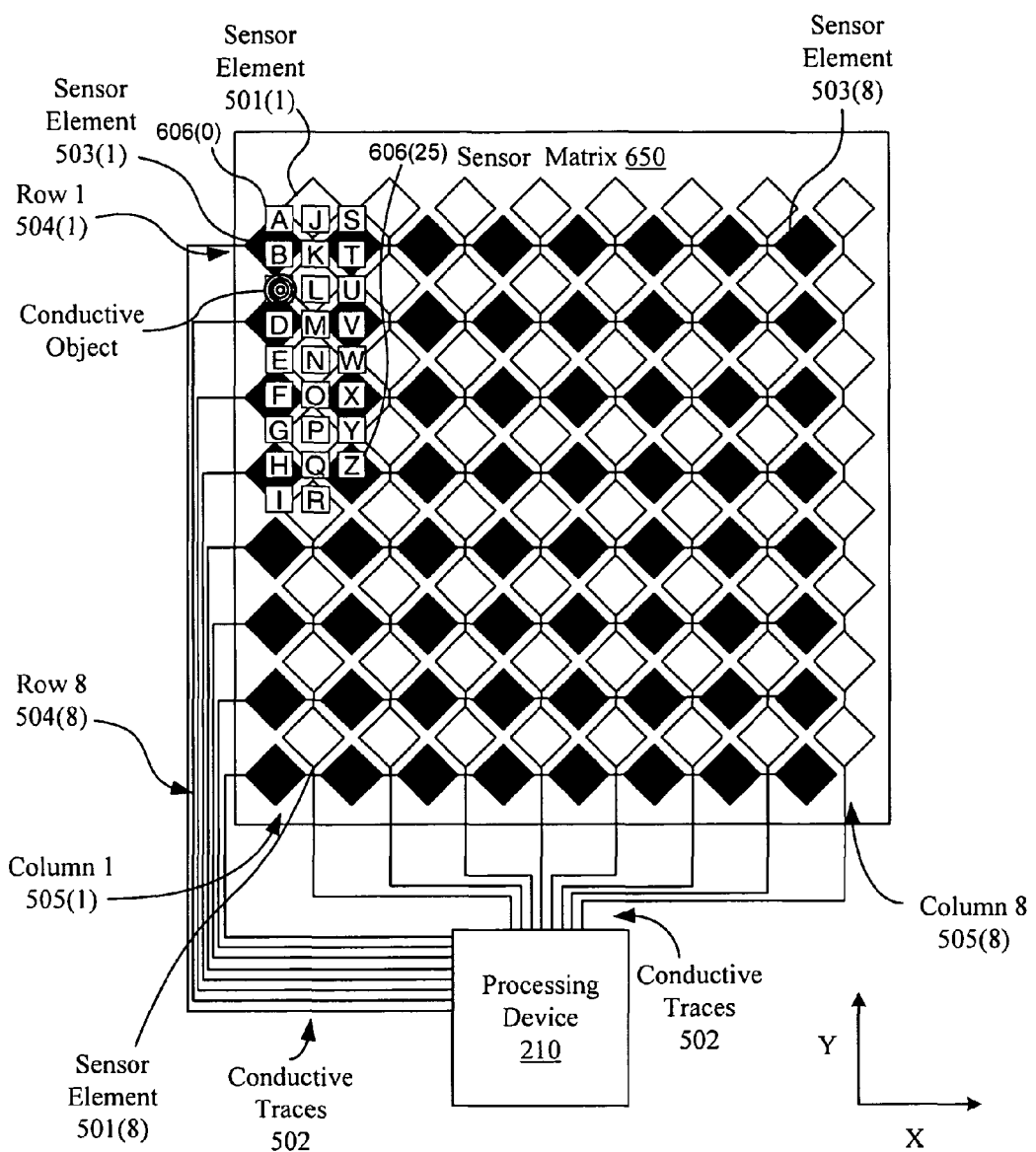
FIG. 6C illustrates one embodiment of a processing device coupled to a sensing device that has a capacitance sensor matrix and keyboard keys A-Z assigned to pre-defined areas of the sensing device.

This embodiment includes 3×3 capacitance sensor matrix. However, it should be noted that other dimensions may be used to detect the presence of the conductive object. Similarly, it should be noted that the embodiments are not limited to 48 buttons, or the configuration of the 48 buttons in a 6×8 matrix, but may include any number of keyboard keys, such as 2 to 107 keyboard keys, and other configurations (such as illustrated in FIG. 6C). It is also contemplated that a keyboard having more than 107 keyboard keys may be implemented using a capacitance sensor matrix, as described herein.

FIG. 6C illustrates one embodiment of processing device 210 coupled to a sensing device that has a capacitance sensor matrix 650 and keyboard keys A-Z 606(0)-606(25) assigned to pre-defined areas of the sensing device. Capacitance sensor matrix 600 includes eight rows 504(1)-504(8) and eight columns 505(1)-505(8). The rows and columns have 8 sensor elements each, sensor elements 501(1)-501(8) and 503(1)-503(8). Rows 504(1)-504(8) are coupled to processing device 210 using capacitance sensing pins, conductive traces 502. Columns 505(1)-505(8) are coupled to processing device 210 using capacitance sensing pins, conductive traces 502. Since sensor matrix 650 is an 8×8 matrix, there are 16 total capacitance sensing pins that couple the sensor matrix 650 to the processing device 210. Keyboard keys 606(0)-606(25), which represent the letters A to Z of the alphabet, are assigned to pre-defined areas of the sensing device. In particular, the keyboard keys are assigned to the upper-left most area of the sensing device. In one embodiment, the remaining surface area of the sensing device that is not assigned pre-defined areas of keyboard keys may be used for other functionality, such as cursor positioning, or the like. Alternatively, the remaining surface area may be assigned additional keyboard keys. It should also be noted that the 26 keys represented in FIG. 6C may be different keyboard keys than those 26 keys, such as alphanumeric characters of other languages, function keys, and the like.

As previously described, after the keyboard keys have been assigned a pre-defined area of the sensing device, a presence of a conductive object can be detected on the sensing device. In this embodiment, the conductive object 303 is detected in the pre-defined area of the keyboard key C 606(2). In particular, the processing device 210 determines the position of the presence of the conductive object 303, and selects the keyboard key C 606(2), which has been pressed, based on the pre-defined areas and the position of the presence of the conductive object 303. Selecting the keyboard may include comparing the position with the pre-defined areas, determining that the keyboard key C 606(2) has been pressed. Once the keyboard key C has been selected, the processing device may output keyboard data that corresponds to the keyboard key C to a component external to the processing device. The component may be a processor, a driver of a processor, or an embedded controller.

In this embodiment, similar method as to those described above may be used to determine the position of the presence of the conductive object 303. Similarly, as described above, the keyboard keys 606(0)-606(25) can be assigned to pre-defined areas using a data structure. After determining the position of the conductive object 303, the processing device 210 can compare the position with the pre-defined areas of the data structure to select which keyboard key has been pressed; in this case, keyboard key C 606(2).

Figure 6D:
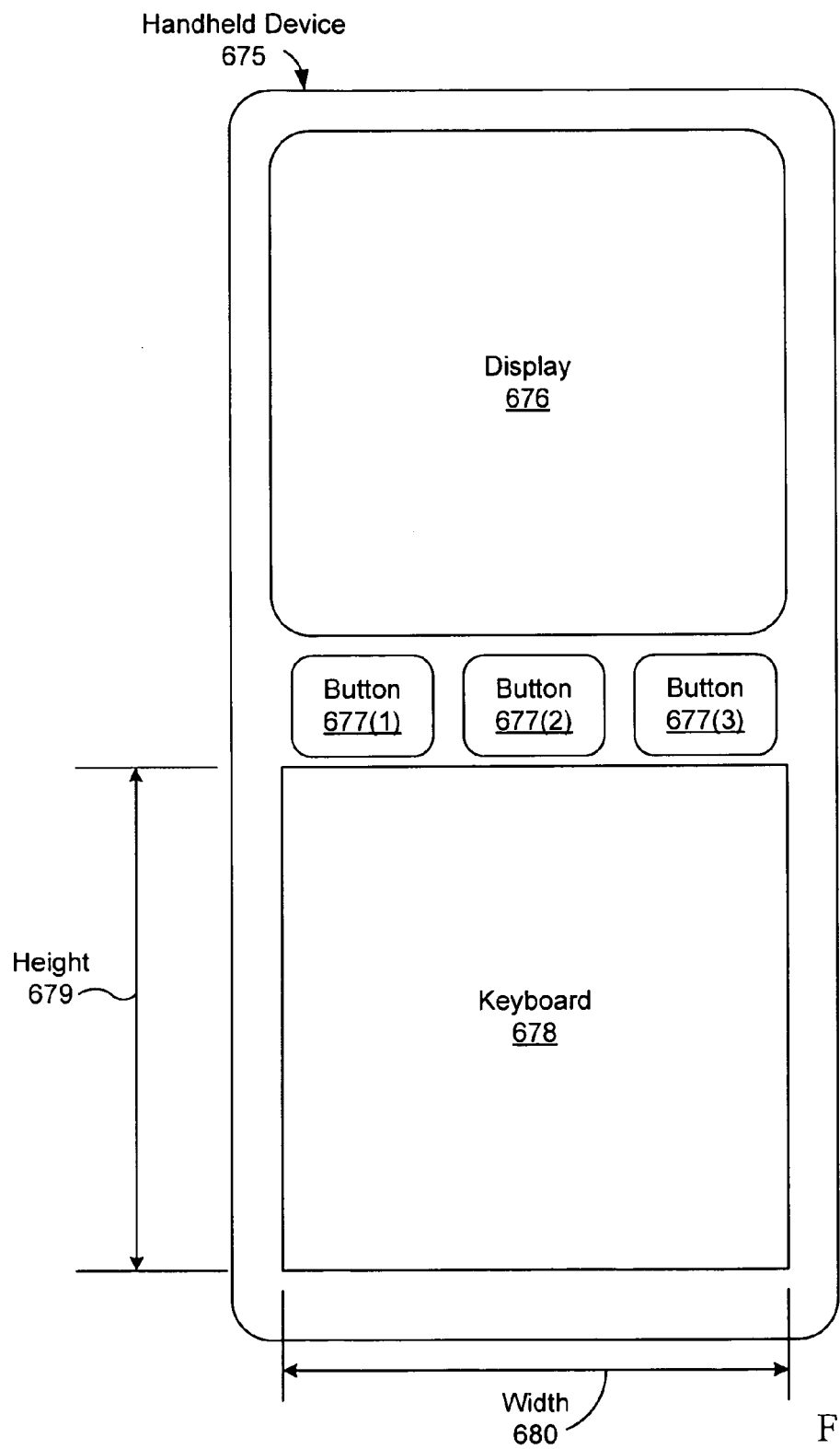
FIG. 6D illustrates one embodiment of a handheld device having a keyboard.

FIG. 6D illustrates one embodiment of a handheld device 678. Handheld device 675 includes a keyboard 675 having a keyboard 678, buttons 677(1)-677(3), and keyboard 678. Display 676 may be a liquid crystal display (LCD) or other displays known by those of ordinary skill in the art. Display 676 may be used to display video, graphics, text, or the like. Alternatively, display 676 may be used as a graphical user interface (GUI). The GUI may be implemented with a touch-screen display. This touch-screen display may be resistive or capacitive type sensing.

Buttons 677(1)-677(3) are additional buttons for the handheld device. These buttons may be mechanical buttons, or alternatively, may be capacitance sensing buttons. These buttons may be used to provide additional button functionality to the handheld device. In another embodiment, the buttons may be incorporated with the keyboard 678, or not included at all in the handheld device 675.

As previously described, by implementing the keyboard in a touch-screen display, the real estate of the screen of display 676 is reduced. In order to not reduce the screen of display 676, handheld device 675 includes a keyboard 678 in addition to the display 676. Keyboard 678 includes a capacitance sensor matrix, as described in the embodiments herein. They keyboard 678 may have multiple keys, for example, 48, 83, 84, 101, 102, 104, 105, 107, or more keyboard keys (as described in more detail below). They keyboard 678 may have a layout, such as QWERTY, Dvorak, foreign-language layouts (e.g. "keyboard AZERTY" in French-speaking countries), a space-cadet, or APL keyboard layouts. Alternatively, other customized layouts may be used.

In one embodiment, the keyboard 678 may be a PC keyboard. The PC keyboard has evolved over time to include more keys. For example, the PC/XT keyboard layout has 83 keyboard keys. It includes original left hand side function key (F key) columns with 10 keys F1 through F10. These types of keyboards may not be compatible with later keyboard types. The PC/AT keyboard layout includes 84 keys, and the 84$^{th}$ key is the system request key (e.g., SysRq). The numerical block is clearly separated from the main keyboard, and they PC/AT layout includes indicator LEDs for Caps/Scroll/NumLock. One enhanced keyboard layout includes 101 keyboard keys. This enhanced layout includes additional navigation and control keys, 12 function keys in row along the top of the main keyboard, often grouped as F1-F4, F5-F8, and F9-12. Another enhanced layout includes 102 keyboard keys. This layout is similar to the layout of 101 keys, but includes an additional key to the right of the left Shift key for European layouts. Another enhanced layout is the Windows® keyboard layout, which includes additional keys for the Windows® key (which provides a shortcut to open the "Start" menu in Windows® standard Explorer shell) and menu keys. Correspondingly, the European layouts included 105 keys for the additional key to the right of the left Shift key. An additional enhanced layout includes 107 keyboard keys, which includes the additional keys, such as Wake, Sleep, and Power keys for power management functionality. Alternatively, there are additional enhanced layouts that are called multimedia keyboard layouts, which may offer additional buttons to the 104 or 107 "standard" keys, often providing volume control, media player buttons, and miscellaneous user-configurable shortcuts, e.g., to email clients, web browsers, document folders, applications, etc. It should be noted that the embodiments described herein are not limited to PC keyboards, and PC keyboard keys, but may include other keyboard keys for other platforms and other systems.

In one embodiment, handheld device 675 is a mobile handset. Alternatively, handheld device 675 may be PDA, Smartphone, or laptop. Alternatively, the embodiments described herein may be used in a keyboard, a television, a remote control, a display, a handheld multi-media device (e.g., MP3 player), a handheld video player, a handheld gaming device, a control panel, or the like.

In one embodiment, the keyboard 678 may include a capacitance sensor matrix, as describe above, and both keyboard keys and cursor positioning may be implemented on the same sensor matrix. Alternatively, the processing device may be coupled to both the sensor matrix of a keyboard, and an additional user input device, such as a cursor positioning device, a touch-sensor pad, touch-sensor slider, touch-sensor button, mouse, touch-screen display, or the like.

In one embodiment, the keyboard 678 can be implemented within a surface area on a device, such as a handheld device. For example, the keyboard 678 may be a standard PC keyboard (e.g., including 101 to 107 keyboard keys) and may be implemented within a 3 cm×3 cm surface area. For example, keyboard 678 may have a height 679 of 3 cm, and a width 680 of 3 cm. Alternatively, the keyboard 678 may have other dimensions within the same surface area. In another embodiment, the keyboard key 678 may be implemented within a surface are less than 10 cm×10 cm. Alternatively, other surface areas may be used to implement the keyboard keys of keyboard 678.

In one embodiment, the keyboard 678 may be a standard PC keyboard (e.g., including 101 to 107 keyboard keys). The sensing device, which includes keyboard 678, is coupled to processing device 210 using less than 21 capacitance sensing pins. Alternatively, keyboard 678 may include 48 keyboard keys, and the processing device 210 is coupled to the sensing device, which includes the 48 keyboard keys assigned to pre-defined areas of the sensing device, using 4 capacitance sensing pins. In another embodiment, the keyboard 678 includes 101 keyboard keys and the processing device 210 is coupled to the sensing device using less than 12 capacitance sensing pins. Alternatively, the keyboard 678 includes 107 keyboard keys and the processing device 210 is coupled to the sensing device using less than 21 capacitance sensing pins. In another embodiment, the keyboard 678 includes 107 keyboard keys and the processing device 210 is coupled to the sensing device using less than 12 capacitance sensing pins.

Figure 7:
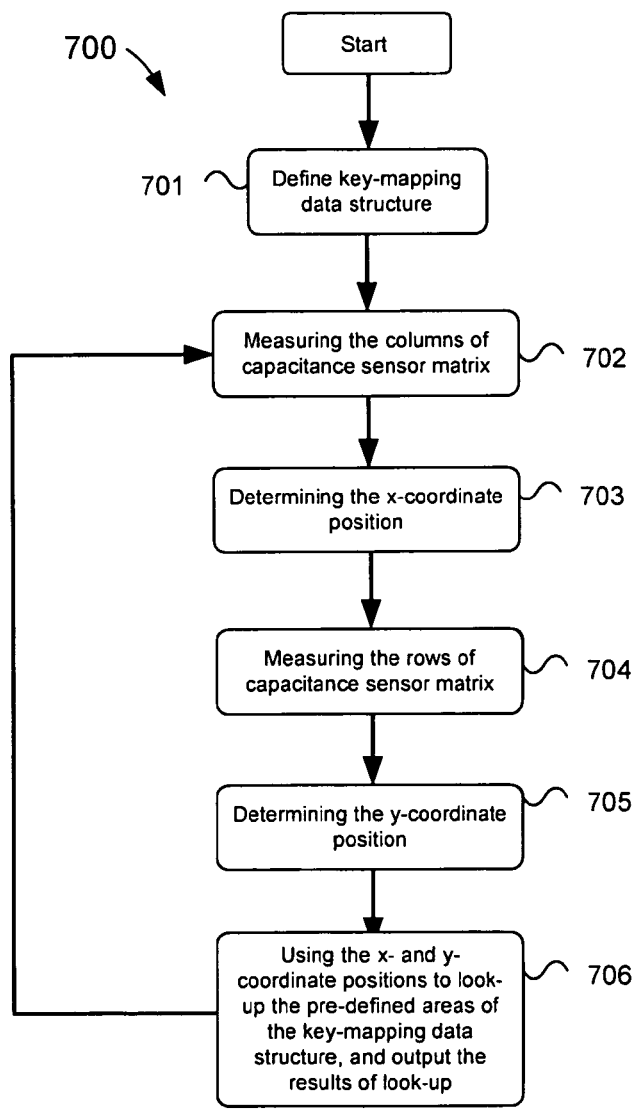
FIG. 7 illustrates a flowchart of one embodiment of a method for detecting a position of a pressed key on a sensing device.

FIG. 7 illustrates a flowchart 700 of one embodiment of a method for detecting a position of a pressed key on a sensing device. Method 700 includes, first, defining the pre-defined areas of the keyboard keys on the sensing device. This may be done by defining a key-mapping data structure, operation 701. The data structure may include positional data of the pre-defined areas of the keyboard keys. The positional data may be the x- and y-coordinate ranges of the pre-defined areas of the keyboard keys. For example, the keyboard key A can be defined as having x- and y-coordinate ranges, such as $\{1<x<3, 7<y<9\}$, the keyboard key B can be defined as having different x- and y-coordinate range, such as $\{4<x<6, 7<y<9\}$, and so on for the additional keyboard keys. Next, the processing device scans and measures the columns of the capacitance sensing matrix, operation 702, to determine the x-coordinate of the detected presence of the conductive object on the sensing device, operation 703. This may be done using the embodiments of described herein with respect to FIGS. 3A-3C, and 4. For example, determining the x-coordinate may result in x=4.8. Next, the processing device scans and measures the rows of the capacitance sensing matrix, operation 704, to determine the y-coordinate of the detected presence of the conductive object on the sensing device, operation 704. This may also be done using the embodiments of described herein with respect to FIGS. 3A-3C, and 4. For example, determining the x-coordinate may result in y=8.1. Next, using the x- and y-coordinate positions of the conductive object, the position of the conductive object may be compared with the positional data of the pre-defined areas of the data structure to determine which keyboard key has been pressed, operation 706. This may be done using a look-up table to determine the pre-defined area of the keyboard key that was pressed within the key-mapping data structure. Accordingly, the look-up results of the data structure are output from the processing device. In the example where x=4.8, and y=8.1, the position of the detected presence falls within the range of pre-defined area of keyboard key B. Accordingly, the key B is output in response to these measurements of the sensing device.

Alternatively, the method may be performed in different orders, such as measuring the rows before the columns, or measuring both rows and columns before making the determination of the x- and y-coordinates.

Figure 8:
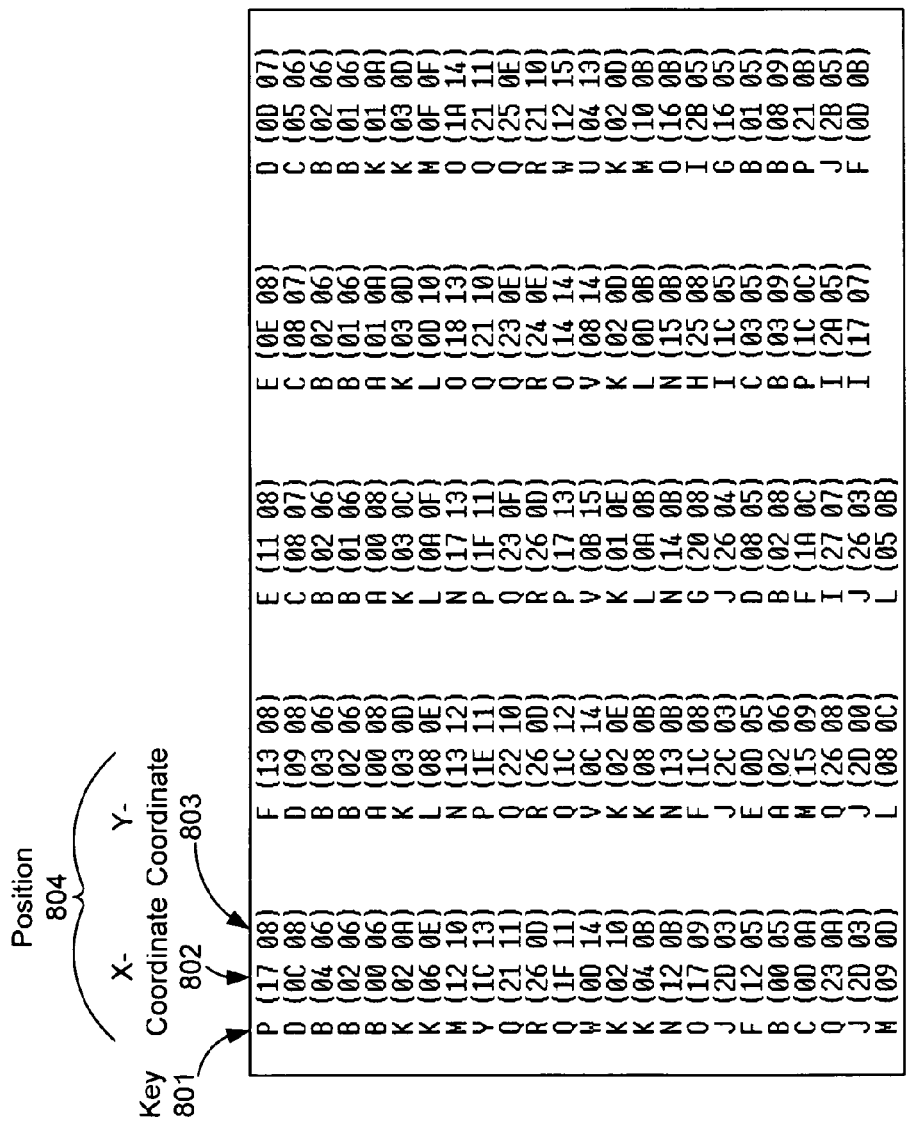
FIG. 8 illustrates a table of one exemplary embodiment of output positions of multiple keyboard keys.

FIG. 8 illustrates a table of one exemplary embodiment of output positions of multiple keyboard keys. Table 800 includes the output positions 804 of multiple keyboard keys. Table 800 includes three entries for each column, the key 801, x-coordinate position 802, and y-coordinate position 803. The x- and y-coordinate positions 801 and 802 are the values of the positions determined by measuring the capacitance (e.g., capacitance variation) on the rows and columns of the capacitance sensor matrix. The x- and y-coordinate positions 801 and 802 are used to determine the keyboard key 801 that was pressed. This may be done by comparing the x- and y-coordinate positions 801 and 802 to the pre-defined areas of a key-mapping data structure. For example, the first row of the first column includes the results from determining that the conductive object is present on the sensing device at x-coordinate position of 17 (hex) and y-coordinate position of 08 (hex). Using these coordinate positions, it is determined that the key 801 that is pressed is the keyboard key P.

Embodiments of the present invention, described herein, include various operations. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a machine-readable medium. These instructions may be used to program a general-purpose or special-purpose processor to perform the described operations. A machine-readable medium includes any mechanism for storing or transmitting information in a form (e.g., software, processing application) readable by a machine (e.g., a computer). The machine-readable medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory; electrical, optical, acoustical, or other form of propagated signal (e.g., carrier waves, infrared signals, digital signals, etc.); or another type of medium suitable for storing electronic instructions.

Additionally, some embodiments may be practiced in distributed computing environments where the machine-readable medium is stored on and/or executed by more than one computer system. In addition, the information transferred between computer systems may either be pulled or pushed across the communication medium connecting the computer systems.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. An apparatus comprising:

a sensing device comprising a plurality of sensor elements to detect a conductive object, wherein a plurality of keyboard keys are assigned to correspond to pre-defined areas of the sensing device, wherein the pre-defined areas are disposed adjacent to one another without any space between, wherein at least one of the plurality of sensor elements corresponds to multiple pre-defined areas, and a number of the plurality of keyboard keys is greater than a number of the sensor elements, and wherein each of the pre-defined areas corresponds to a separate one of the plurality of keyboard keys; and a processing device coupled to the sensing device, and comprising a look-up table storing positional data of the pre-defined areas, wherein the processing device is operable to determine a position of the conductive object on the sensing device based on measurements representing capacitance on the plurality of sensor elements, to select a keyboard key of the plurality of keyboard keys by comparing the position of the conductive object to the positional data of the pre-defined area of the sensing device corresponding to the keyboard key, and output keyboard data corresponding to the selected keyboard key to a host processor external to the processing device.

2. The apparatus of claim 1 wherein, for each keyboard key of the plurality of keyboard keys, the processing device is operable to select said each keyboard key when the position of the conductive object is determined to be at any location within the pre-defined area corresponding to said each keyboard key.

3. The apparatus of claim 1, wherein a total surface area of the plurality of keyboard keys that are assigned is less than approximately 10 centimeters (cm) by 10 cm.

4. The apparatus of claim 1, wherein the sensing device is mounted on a handheld device.

5. The apparatus of claim 1, wherein the sensing device is mounted on a smart phone.

6. The apparatus of claim 1, wherein the pre-defined areas are arranged into multiple rows on the sensing device, wherein the plurality of sensor elements are arranged in a plurality rows of sensor elements, and wherein at least one of the plurality rows of sensor elements corresponds to a plurality of rows of the pre-defined areas.

7. The apparatus of claim 1, wherein the sensing device comprises a capacitance sensor matrix comprising the plurality of sensor elements configured in rows and columns to detect the conductive object on the sensing device, wherein each row and column is coupled to the processing device using one of multiple capacitance sensing pins, and wherein the plurality of keyboard keys are assigned to the pre-defined areas of the capacitance sensor matrix.

8. The apparatus of claim 1, wherein the processing device comprises one or more capacitance sensors coupled to the capacitance sensor matrix, wherein the one or more capacitance sensors are operable to measure a capacitance of each row of sensor elements of the capacitance sensor matrix, and to measure a capacitance of each column of sensor elements of the capacitance sensor matrix, and wherein the processing device is operable to determine the position of the conductive object using the measured capacitances of the rows and columns of sensor elements of the capacitance sensor matrix.

9. The apparatus of claim 1, wherein the host processor external to the processing device is at least one of a processor, a driver of a processor, or an embedded controller.

10. The apparatus of claim 1, wherein the pre-defined areas are specified in a data structure that includes positional data of the pre-defined areas.

11. The apparatus of claim 1, wherein the processing device is coupled to the sensing device using capacitance sensing pins, and wherein the processing device is operable to determine the position of the conductive object by measuring the capacitance on the capacitance sensing pins.

12. The apparatus of claim 1, wherein the pre-defined areas are defined with respect to positional coordinates on a sensing surface of the sensing device.

13. A method comprising:
assigning a plurality of keyboard keys to correspond to pre-defined areas of a sensing device having a plurality of sensor elements, wherein the pre-defined areas are disposed adjacent to one another without any space between, wherein at least one of the plurality of sensor elements corresponds to multiple pre-defined areas, and a number of the plurality of keyboard keys is greater than a number of the sensor elements, and wherein each of the pre-defined areas corresponds to a separate one of the plurality of keyboard keys;

determining a position of conductive object on the sensing device based on measurements representing capacitance on the plurality of sensor elements;

selecting a keyboard key of the plurality of keyboard keys by comparing the position of the conductive object to positional data of the pre-defined area of the sensing device corresponding to the keyboard key, wherein the positional data of the pre-defined area is stored in a processing device; and outputting keyboard data corresponding to the selected keyboard key from the processing device to a component external to the processing device.

14. The method of claim 13 further comprising, for each keyboard key of the plurality of keyboard keys, selecting said each keyboard key when the position of the conductive object is determined to be at any location within the pre-defined area corresponding to said each keyboard key.

15. The method of claim 13, wherein a total surface area of the plurality of keyboard keys that are assigned is less than approximately 10 centimeters (cm) by 10 cm.

16. The method of claim 13, wherein the sensing device is mounted on a handheld device.

17. The method of claim 13, wherein the sensing device is mounted on a smart-phone.

18. The method of claim 13, wherein the pre-defined areas are arranged into multiple rows on the sensing device, wherein the plurality of sensor elements are arranged in a plurality of rows of sensor elements, and wherein at least one of the plurality of rows of sensor elements corresponds to a plurality of rows of the pre-defined areas.

19. The method of claim 13, wherein the sensing device comprises a capacitance sensor matrix comprising the plurality of sensor elements configured in rows and columns to detect the conductive object on the sensing device, wherein each row and column is coupled to a processing device using one of multiple capacitance sensing pins and wherein the plurality of keyboard keys are assigned to the pre-defined areas of the capacitance sensor matrix.

20. The method of claim 13, wherein the processing device comprises one or more capacitance sensors coupled to the capacitance sensor matrix, wherein the method further comprises the one or more capacitance sensors measuring a capacitance of each row of sensor elements of the capacitance sensor matrix and measuring a capacitance of each column of sensor elements of the capacitance sensor matrix, and wherein determining the position of the conductive object comprises using the measured capacitances of the rows and columns of sensor elements of the capacitance sensor matrix.

21. The apparatus of claim 13, wherein the host processor external to the processing device is at least one of a processor, a driver of a processor, or an embedded controller.

22. The apparatus of claim 13, wherein the assigning the plurality of keyboard keys to comprises defining a data structure comprising positional data of the pre-defined areas, wherein selecting the keyboard key comprises comparing the position of the conductive object with the positional data of the pre-defined areas in the data structure to determine that the selected keyboard key is pressed, and wherein outputting the keyboard data comprises outputting the keyboard data that corresponds to the pressed keyboard key.

23. The method of claim 13, wherein the pre-defined areas are defined with respect to positional coordinates on a sensing surface of the sensing device.

24. The method of claim 13, wherein the sensing device is coupled to a processing device using capacitance sensing pins, and wherein determining the position of the conductive object comprises the processing device measuring the capacitance on the capacitance sensing pins.

* * * * *